(12) United States Patent
Chakraborty et al.

(10) Patent No.: US 11,368,143 B1
(45) Date of Patent: Jun. 21, 2022

(54) MULTIPHASE SIGNAL GENERATOR

(71) Applicant: International Business Machines Corporation, Armonk, NY (US)

(72) Inventors: Sudipto Chakraborty, Plano, TX (US); Rajiv Joshi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/177,302

(22) Filed: Feb. 17, 2021

(51) Int. Cl.
*H03K 5/01* (2006.01)
*G06F 1/08* (2006.01)
*H03K 17/687* (2006.01)
*H03K 5/00* (2006.01)

(52) U.S. Cl.
CPC ............. *H03K 5/01* (2013.01); *G06F 1/08* (2013.01); *H03K 17/6874* (2013.01); *H03K 2005/00286* (2013.01)

(58) Field of Classification Search
CPC ............... H03K 5/01; H03K 17/6874; H03K 2005/00286; G06F 1/08
USPC ......................................................... 327/129
See application file for complete search history.

(56) References Cited

U.S. PATENT DOCUMENTS

| | | | |
|---|---|---|---|
| 6,564,045 B1* | 5/2003 | Fransis | H03D 7/1433 455/189.1 |
| 6,931,089 B2 | 8/2005 | Wu et al. | |
| 6,943,606 B2 | 9/2005 | Dunning | |
| 7,423,469 B2 | 9/2008 | Pickering et al. | |
| 7,911,281 B2 | 3/2011 | Hoshino et al. | |
| 8,058,949 B2* | 11/2011 | Ko | H03H 7/06 333/172 |
| 8,140,039 B2* | 3/2012 | Luong | H03B 19/00 455/260 |
| 8,634,509 B2 | 1/2014 | Crain et al. | |
| 9,485,086 B2 | 11/2016 | Gorecki et al. | |
| 9,608,611 B1 | 3/2017 | Hearne et al. | |
| 9,673,972 B2 | 6/2017 | Gorecki et al. | |
| 9,960,883 B1* | 5/2018 | Chakraborty | H03D 7/1458 |
| 10,348,528 B2* | 7/2019 | Mittal | H04L 27/36 |
| 10,425,091 B2 | 9/2019 | Jain | |

(Continued)

FOREIGN PATENT DOCUMENTS

CN 106067814 B 12/2018

OTHER PUBLICATIONS

Y. Kong et al., "A Multiplexed Low Power and High Linearity Cascaded Phase Interpolator Design," 14th IEEE International Conference on Solid-State and integrated Circuit Technology (ICSICT), Oct. 2018, 3 pages.

(Continued)

*Primary Examiner* — Ryan Jager
(74) *Attorney, Agent, or Firm* — Samuel Waldbaum; Ryan, Mason & Lewis, LLP

(57) ABSTRACT

An apparatus which includes a multiphase signal generator circuit. The multiphase signal generator circuit is configured to receive as input a complementary analog signal having a fundamental frequency, and generate a plurality of output complementary analog signals. Each output complementary analog signal comprises the same fundamental frequency as the input complementary analog signal, and wherein each output complementary analog signal comprises a different phase.

21 Claims, 16 Drawing Sheets

(56) References Cited

U.S. PATENT DOCUMENTS

| | | | |
|---|---|---|---|
| 10,488,227 B2 | 11/2019 | Amiri et al. | |
| 2003/0002596 A1 | 1/2003 | Dunning et al. | |
| 2006/0293011 A1* | 12/2006 | Park | H03F 3/24 |
| | | | 455/260 |
| 2011/0043286 A1* | 2/2011 | Youngblood | H03D 7/1491 |
| | | | 330/295 |
| 2012/0207259 A1 | 8/2012 | Crain et al. | |
| 2013/0285729 A1* | 10/2013 | Xu | H03K 4/502 |
| | | | 327/308 |
| 2014/0030996 A1* | 1/2014 | Gan | H03D 7/1458 |
| | | | 455/326 |
| 2016/0072620 A1 | 3/2016 | Gorecki et al. | |
| 2016/0212362 A1* | 7/2016 | Pang | H04N 5/3651 |
| 2017/0019067 A1* | 1/2017 | Chakraborty | H03D 7/1458 |
| 2017/0104508 A1* | 4/2017 | Mukundagiri | H04B 5/0031 |
| 2018/0139078 A1* | 5/2018 | Mittal | H03D 7/1458 |
| 2018/0316093 A1 | 11/2018 | Sharvit et al. | |
| 2020/0220524 A1* | 7/2020 | Hong | H01Q 3/36 |
| 2021/0028768 A1* | 1/2021 | Hong | H01P 1/18 |

OTHER PUBLICATIONS

F. Yang et al., "A Low-Power Calibration-Free Fractional-N Digital PLL with High Linear Phase Interpolator," IEEE Asian Solid-State Circuits Conference, Nov. 7-9, 2016, pp. 269-272.

A. Jakobsson et al., "A Low-Noise RC-Based Phase Interpolator in 16-nm CMOS," IEEE Transactions on Circuits and Systems—II: Express Briefs, Jan. 2019, vol. 66, No. 1, pp. 1-5.

* cited by examiner

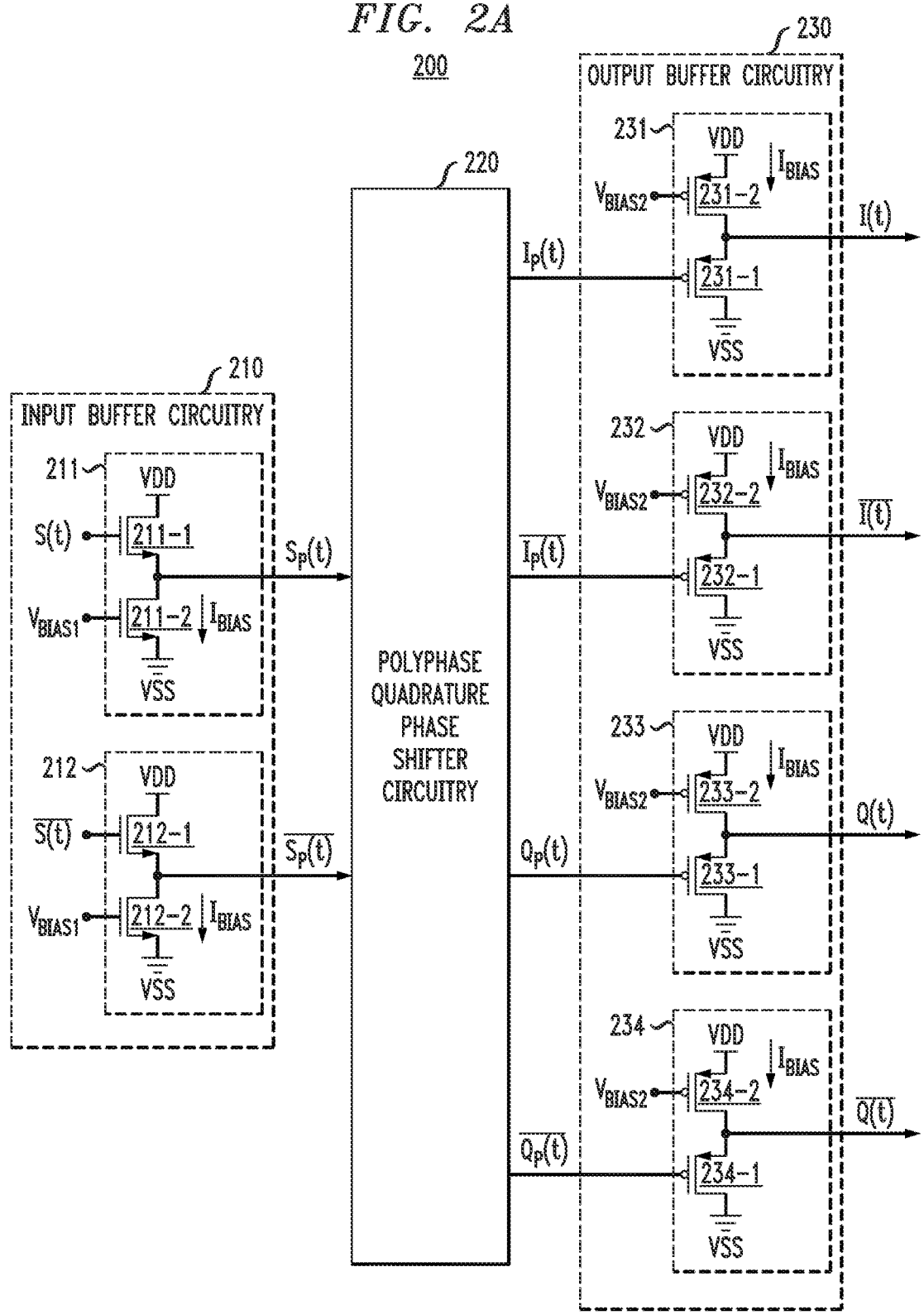

*FIG. 4A*
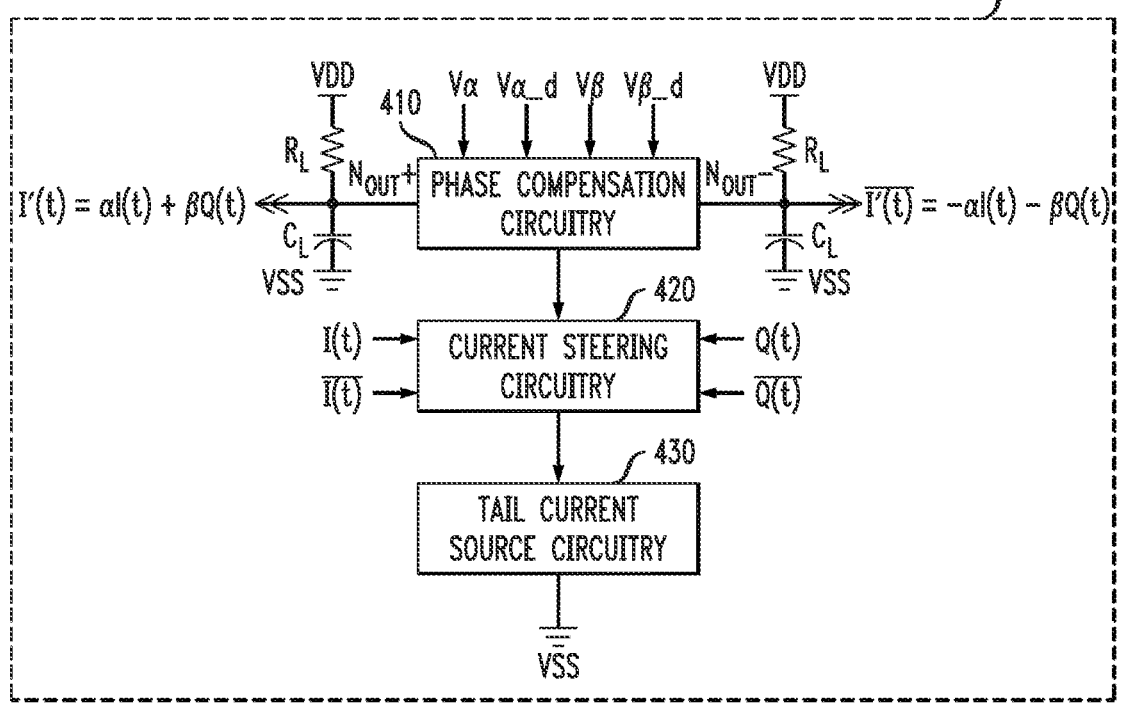
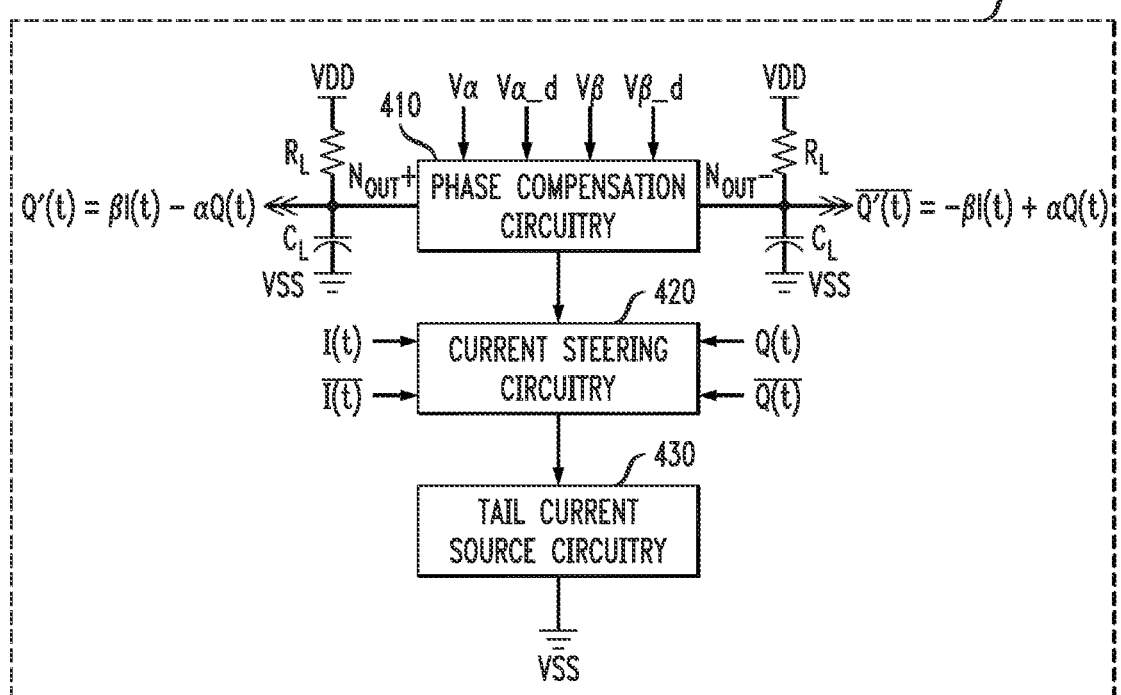

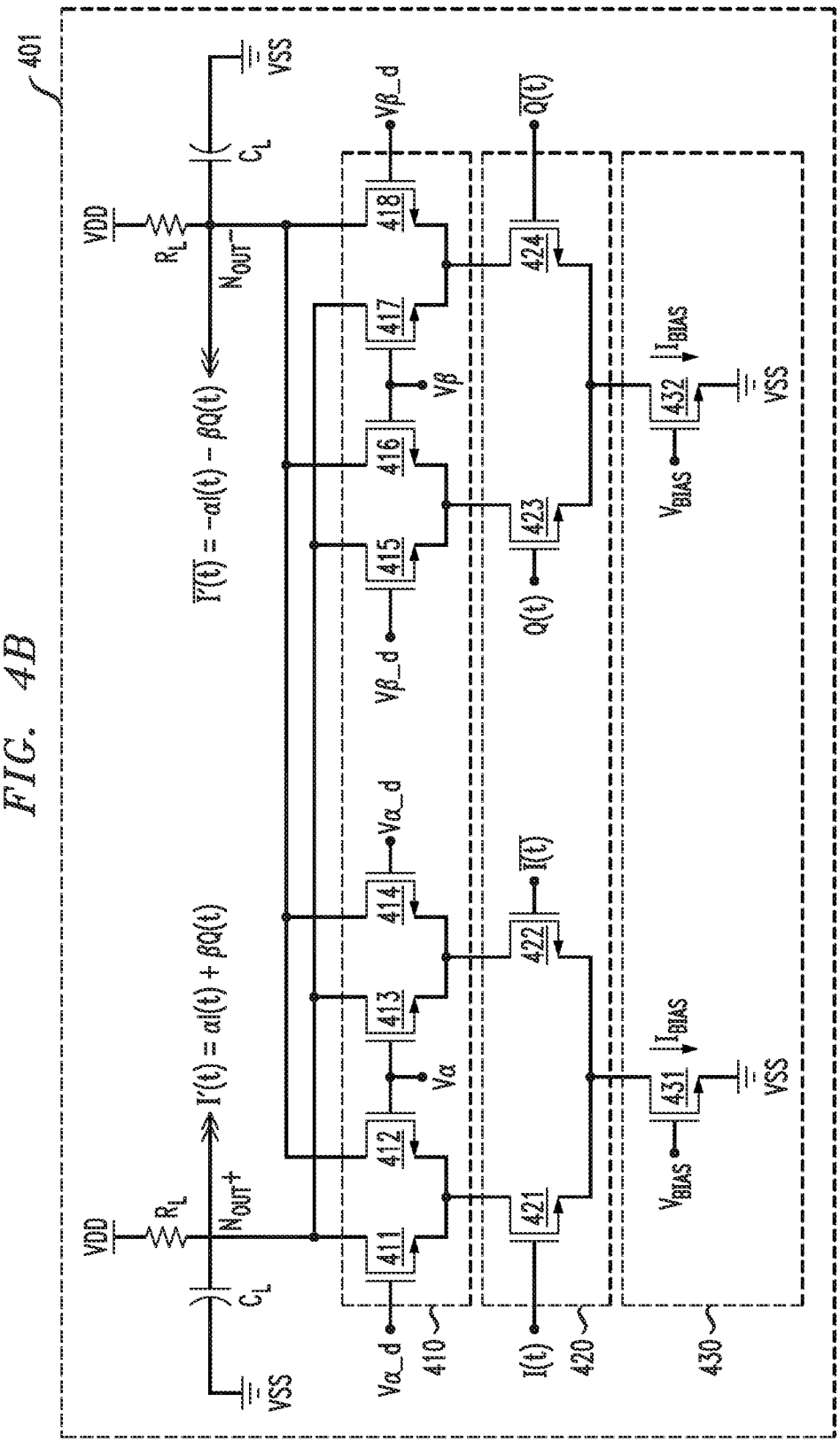

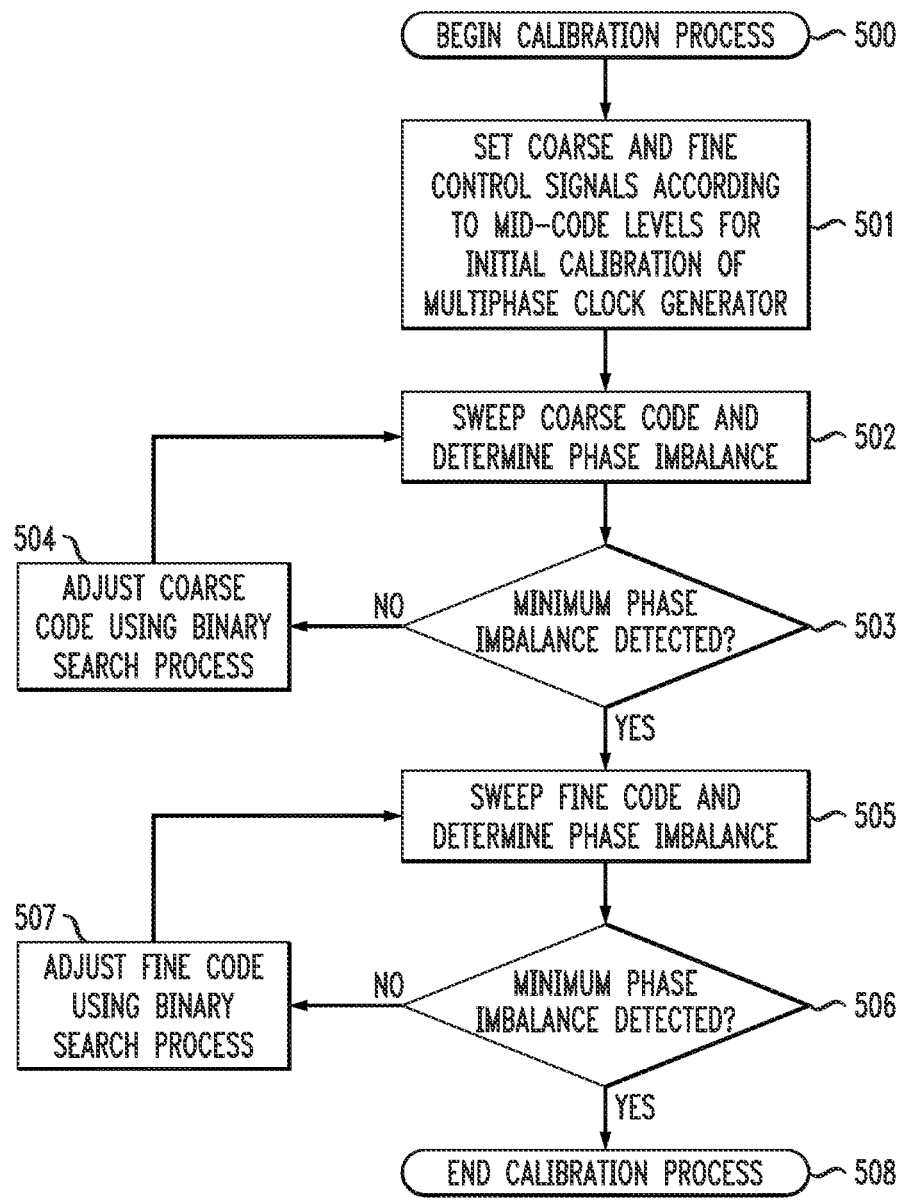

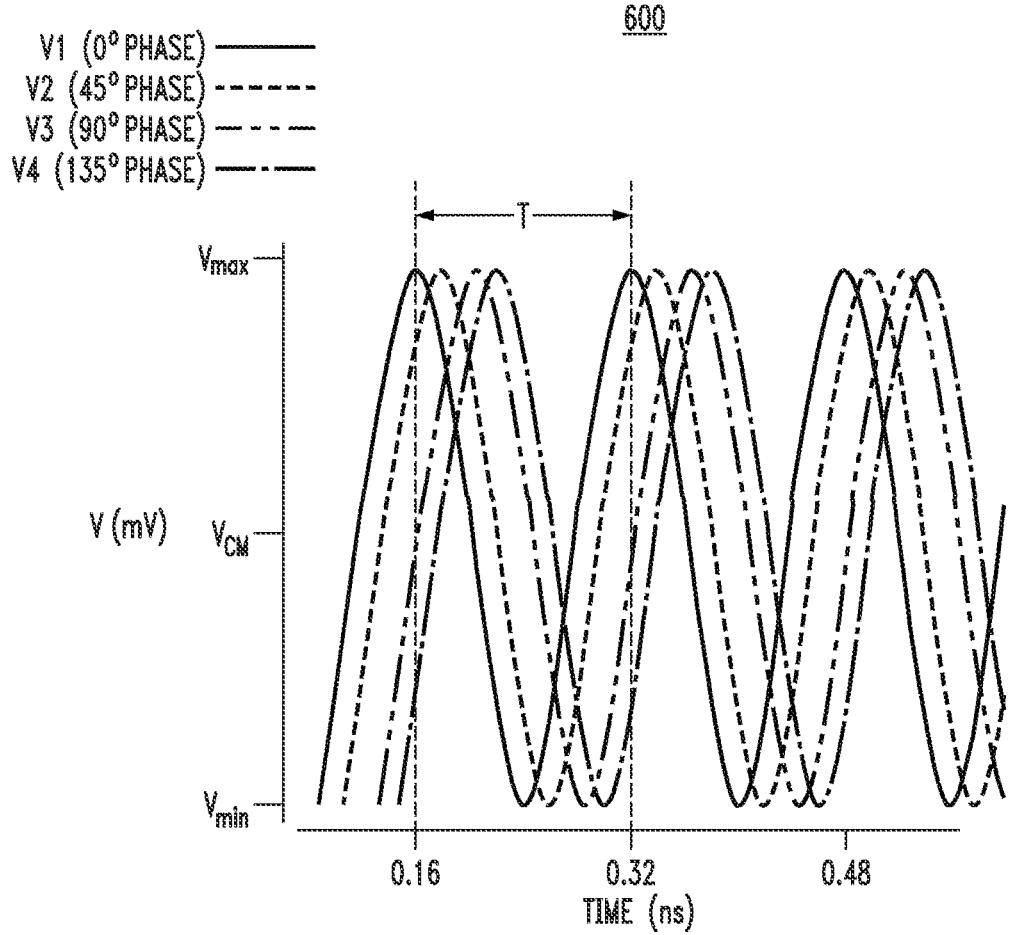

MULTIPHASE SIGNAL GENERATOR

BACKGROUND

This disclosure relates generally to signal generators and, in particular, multiphase signal generators for communications systems. Various communications systems utilize multiple phases of a waveform, such as a clock signal, to perform certain operations such as clock and data recovery operations, serializer/deserializer operations, phase acquisition in phase-locked loops, etc. Typically, phase interpolators are utilized to generate controllable phase shifts of a clock signal or waveform based on a relation of multiple input clock signals or waveforms with different phases. Such input clock signals are typically derived using, for example, a high-speed frequency divider which generates multiple (n) phases a waveform of a given frequency $f$ from a higher frequency oscillator waveform with a frequency $f_O=(n/2)f$, or using a series of connected delay elements (e.g., buffers) which generate a series of delayed clock signals from an input clock signal. Such techniques require high power consumption and can result in increased phase asymmetry and jitter.

SUMMARY

An exemplary embodiment of the disclosure includes an apparatus which comprises a multiphase signal generator circuit. The multiphase signal generator circuit is configured to receive as input a complementary analog signal having a fundamental frequency, and generate a plurality of output complementary analog signals. Each output complementary analog signal comprises the same fundamental frequency as the input complementary analog signal, and wherein each output complementary analog signal comprises a different phase.

Another exemplary embodiment includes a sensor node which comprises at least one sensor device, a communications system, and a multiphase signal generator circuit. The at least one sensor device is configured to generate sensor data. The communications system is configured to transmit the sensor data to a remote node. The multiphase signal generator circuit is configured to receive as input a complementary analog signal having a fundamental frequency, and generate a plurality of output complementary analog signals, wherein each output complementary analog signal comprises the same fundamental frequency as the input complementary analog signal, and wherein each output complementary analog signal comprises a different phase. The communications system is further configured to utilize the plurality of output complementary analog signals generated by the multiphase signal generator circuit to control operations of the communications system.

Other embodiments will be described in the following detailed description of exemplary embodiments, which is to be read in conjunction with the accompanying figures.

BRIEF DESCRIPTION OF THE DRAWINGS

FIG. 2A schematically illustrates a quadrature phase shifter stage of a multiphase clock generator, according to an exemplary embodiment of the disclosure.

FIG. 4A schematically illustrates a phase interpolator according to an exemplary embodiment of the disclosure.

FIG. 4B is a schematic circuit diagram of a first phase interpolation cell of the phase interpolator of FIG. 4A, according to an exemplary embodiment of the disclosure.

FIG. 5 is a flow diagram of a method for calibrating a multiphase clock generator according to an exemplary embodiment of the disclosure.

FIG. 6 illustrates multiple waveform signals having a same frequency and different phases, which can be generated by a multiphase clock generator, according to an exemplary embodiment of the disclosure.

DETAILED DESCRIPTION

Exemplary embodiments of the disclosure will now be described in further detail with regard multiphase clock generators and, in particular low-power multiphase clock generators which can be implemented in communications systems.

It is to be understood that the various features as shown in the accompanying drawings are schematic illustrations that are not drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the term "exemplary" as used herein means "serving as an example, instance, or illustration". Any embodiment or design described herein as "exemplary" is not to be construed as preferred or advantageous over other embodiments or designs.

Further, it is to be understood that the phrase "configured to" used in conjunction with a circuit, structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, the hardware may comprise discrete circuit elements (e.g., transistors, inverters, etc.), programmable elements (e.g., ASICs, FPGAs, etc.), processing devices (e.g., CPUs, GPUs, etc.), one or more integrated circuits, and/or combinations thereof. Thus, by way of example only, when a circuit is defined to be configured to provide a specific functionality, it is intended to cover, but not be limited to, embodiments where the circuit is comprised of elements, processing devices, and/or integrated circuits that enable it to perform the specific functionality when in an operational state (e.g., connected or otherwise deployed in a system, powered on, receiving an input, and/or producing an output), as well as cover embodiments when the circuit is in a non-operational state (e.g., not connected nor otherwise deployed in a system, not powered on, not receiving an input, and/or not producing an output) or in a partial operational state.

Figure 1A:
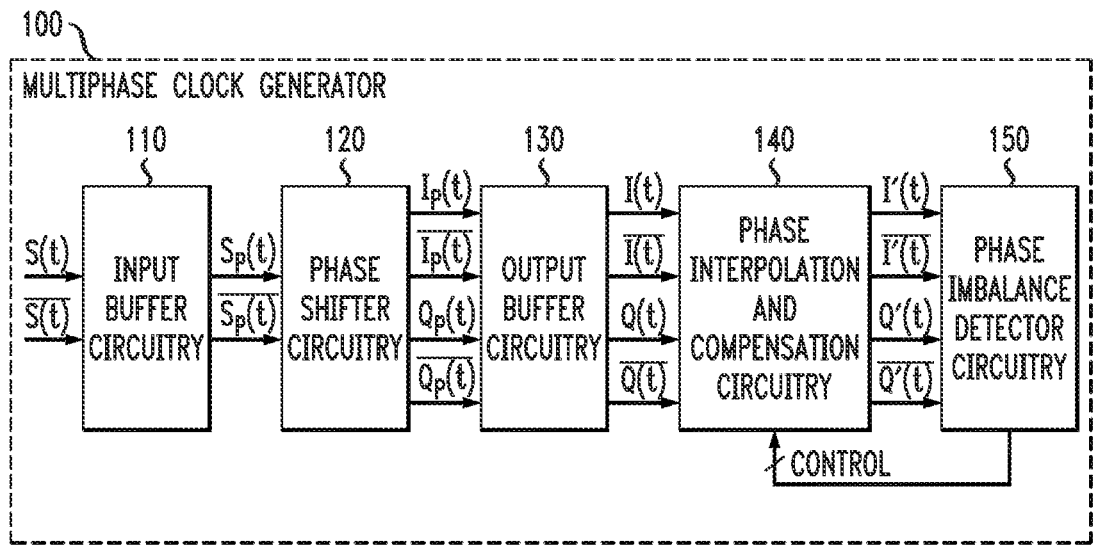
FIG. 1A schematically illustrates a multiphase clock generator according to an exemplary embodiment of the disclosure.

FIG. 1A schematically illustrates a multiphase clock generator 100 according to an exemplary embodiment of the disclosure. The multiphase clock generator 100 comprises a plurality of signal processing stages comprising input buffer circuitry 110 (or input buffer stage 110), phase shifter circuitry 120 (or phase shifter stage 120), output buffer circuitry 130 (or output buffer stage 130), phase interpolation and compensation circuitry 140 (or phase interpolation stage 140), and phase imbalance detector circuitry 150 (or control circuit 150). In some embodiments, the input buffer stage 110, the phase shifter stage 120, and the output buffer stage 130 collectively form a quadrature phase shifter stage which is configured to receive as input a complementary analog signal S(t) and $\overline{S(t)}$ (e.g., reference differential clock signal) and generate a complementary analog quadrature signal I(t)/Q(t) and $\overline{I(t)}/\overline{Q(t)}$ including a complementary analog in-phase signal I(t) and $\overline{I(t)}$, and a complementary analog quadrature-phase signal Q(t) and $\overline{Q(t)}$. Exemplary embodiments of the input buffer stage 110, the phase shifter stage 120, and the output buffer stage 130 will be discussed in further detail below in conjunction with FIGS. 2A, 2B, 3A, and 3B.

The complementary analog signal S(t) and $\overline{S(t)}$ (or alternatively, complementary pair of analog signals S(t) and $\overline{S(t)}$) comprises a pair of analog signals which are complements to each other in that the pair of analog signals S(t) and $\overline{S(t)}$ are equal in magnitude and frequency, but with a 180-degree phase difference. The complementary analog in-phase signal I(t) and $\overline{I(t)}$ (or alternatively, complementary pair of analog in-phase signals I(t) and $\overline{I(t)}$) comprises a pair of analog in-phase (I) signals which are complements to each other in that the pair of analog in-phase signals I(t) and $\overline{I(t)}$ are equal in magnitude and frequency, but with a 180-degree phase difference. Similarly, the complementary analog quadrature-phase signal Q(t) and $\overline{Q(t)}$ (or alternatively, complementary pair of analog quadrature-phase signals Q(t) and $\overline{Q(t)}$) comprises a pair of analog quadrature-phase (Q) signals which are complements to each other in that the pair of analog quadrature-phase signals Q(t) and $\overline{Q(t)}$ are equal in magnitude and frequency, but with a 180-degree phase difference. The analog quadrature signal I(t)/Q(t) (or alternatively, pair of analog quadrature signals I(t) and Q(t)) comprises a pair of analog quadrature signals I(t) and Q(t) which have the same frequency but differ in phase by 90 degrees. Similarly, the analog quadrature signal $\overline{I(t)}/\overline{Q(t)}$ comprises a pair analog quadrature signals $\overline{I(t)}$ and $\overline{Q(t)}$ which have the same frequency but differ in phase by 90 degrees. In such embodiments, the analog signals I(t), Q(t), $\overline{I(t)}$, and $\overline{Q(t)}$ represent respective phases of 0°, 90°, 180°, and 270° of the analog reference signal S(t).

More specifically, for purposes of discussion, ideally, the complementary pair of analog signals S(t) and $\overline{S(t)}$ have a same fundamental frequency $f_O$, and respective phases of 0 degrees and 180 degrees. Further, ideally, the complementary pair of analog in-phase signals I(t) and $\overline{I(t)}$ have the same fundamental frequency $f_O$ as the input analog signals S(t) and $\overline{S(t)}$, and respective phases of 0 degrees and 180 degrees. Moreover, ideally, the complementary pair of analog quadrature-phase signals Q(t) and $\overline{Q(t)}$ have the same fundamental frequency $f_O$ as the input analog signals S(t) and $\overline{S(t)}$, and respective phases of 90 degrees and 270 degrees. In this regard, the analog in-phase signal I(t) (alternatively referred to herein as CLK_0 signal) and the analog quadrature-phase signal Q(t) (alternatively referred to herein as CLK_90 signal) comprise a pair of quadrature signals which have the same frequency $f_O$, but differ in phase by 90 degrees. Similarly, the analog in-phase signal $\overline{I(t)}$ (alternatively referred to herein as CLK_180 signal) and the analog quadrature-phase signal $\overline{Q(t)}$ (alternatively referred to herein as CLK_270 signal) comprise a pair of quadrature signals which have the same frequency $f_O$, but differ in phase by 90 degrees.

The phase interpolation and compensation stage 140 is configured to receive, as reference input signals, the complementary analog in-phase signals I(t) and $\overline{I(t)}$ (CLK_0 and CLK_180), and the complementary analog quadrature-phase signals Q(t) and $\overline{Q(t)}$ (CLK_90 and CLK_270), and interpolate between combinations of such input reference signals in a controlled manner based on direct-current (DC) control voltage signals to generate one or more clock output signals having phases that are a weighted summation of the phases of the input reference signals. In some embodiments, as explained in further detail below, the DC control voltage signals that are input to the phase interpolation and compensation stage 140 comprise DC interpolation weight voltages which correspond to scalar weights or interpolation coefficients that are utilized to control the phase interpolation process.

In some embodiments, the multiphase clock generator 100 is implemented in conjunction with a communications system (e.g., transmitter or receiver) which utilizes IQ modulation. In such embodiments, as shown in FIG. 1A, the phase interpolation and compensation stage 140 is configured to output phase-corrected complementary analog in-phase signals I'(t) and $\overline{I'(t)}$ (CLK_0 and CLK_180), and phase-corrected complementary analog quadrature-phase signals Q'(t) and $\overline{Q'(t)}$ (CLK_90 and CLK_270). In other words, in some embodiments, the phase interpolation and compensation stage 140 is configured to adjust the phases of the input reference signals I(t), $\overline{I(t)}$, Q(t), and $\overline{Q(t)}$ to correct any phase imbalances (or phase error) that may exist in the quadrature signals I(t), $\overline{I(t)}$, Q(t), and $\overline{Q(t)}$ which are generated by the phase shifter stage 120. In this manner, the phase-corrected complementary in-phase signals I'(t) and $\overline{I'(t)}$ and the phase-corrected quadrature-phase signals Q'(t) and $\overline{Q'(t)}$ have the proper phase relations, and can be utilized, as desired, for a given application, e.g., complementary quadrature local oscillator (LO) signals that are input to mixers to perform an IQ modulation process. It is to be understood that the multiphase clock generator 100 can be implemented as a multiphase signal generator for any suitable application in which multiple phases of a signal waveform (other than a clock signal per se) are needed to certain operations.

In other embodiments, the multiphase clock generator 100 can be implemented for other applications in which multiple phases of a reference analog waveform (e.g., clock signal) are utilized for certain functions. In this regard, in some embodiments, the phase interpolation and compensation stage 140 is configured to perform a weighed interpolation between the phases of the input reference signals I(t), $\overline{I(t)}$, Q(t), and $\overline{Q(t)}$ to generate one or more of N phases of the reference clock S(t) and its complement $\overline{S(t)}$. In this implementation, the phase interpolation and compensation stage 140 can be configured to perform a phase modulation process by using the DC interpolation weight voltage signals as scalar weights to effectively vary the amplitudes of the input reference signals I(t), $\overline{I(t)}$, Q(t), and $\overline{Q(t)}$ in a controlled manner to thereby generate one or more phases within a range of 0° to 360°. By selectively combining the signals I(t) and Q(t) (0 and 90 phases) and their respective inversions $\overline{I(t)}$ and $\overline{Q(t)}$ (180 and 270 phases), and applying the proper scaling, various phases can be obtained within a range of 0° to 360°.

In some embodiments, the phase imbalance detector circuitry 150 is configured to detect phase imbalances (or phase error) between I'(t) and Q'(t) and between $\overline{I'(t)}$ and $\overline{Q'(t)}$ and generate control signals to drive the "up and down" phase correction or phase adjustment steps of the phase interpolation and compensation stage 140 to achieve target phases and phase relationships. For example, in some embodiments, the phase imbalance detector circuitry 150 is configured to perform a vector multiplication operation to detect a phase imbalance between I'(t) and Q'(t). More specifically, in some embodiments, the phase imbalance detector circuitry 150 is configured to perform "dot product" or "scalar product" operations between the signals I'(t) and Q'(t). As is known in the art, a scalar product is an operation which multiplies two vectors and returns a scalar quantity, wherein the dot product is defined as the product of the magnitudes of the two vectors and the cosine of the angle between the two vectors: A·B=|A||B| cos θ. When θ=0, then cos(0)=1, and cos A·B=AB. On the other hand, when θ=90, then cos(90)=0, and cos A·B=0.

In this regard, in some embodiments, phase imbalance detector circuitry 150 is configured to perform a dot product of I'(t) and Q'(t) to determine an amount of phase imbalance (or phase error) between I'(t) and Q'(t) and, thus, between $\overline{I'(t)}$ and $\overline{Q'(t)}$. Since I'(t) and Q'(t) should, ideally, have a phase difference of 90 degrees, a dot product of I'(t) and Q'(t) should be I'(t)·Q'(t)=0. Similarly, since $\overline{I'(t)}$ and $\overline{Q'(t)}$ should, ideally, have a phase difference of 90 degrees, a dot product of $\overline{I'(t)}$ and $\overline{Q'(t)}$ should be $\overline{I'(t)}$·$\overline{Q'(t)}$=0. Accordingly, when performing such scalar product operations, a resulting scalar value other than 0 will mean that the phase difference between I'(t) and Q'(t), or the phase difference between $\overline{I'(t)}$ and $\overline{Q'(t)}$, is something other than 90 degrees. The magnitude (and sign) of the computed scalar value provides an indication of an amount of phase imbalance or phase error that exists between I'(t) and Q'(t) and a given time. As explained in further detail below, the phase imbalance detector circuitry 150 is configured to determine and generate the proper up/down DC weight control signals that are input to the phase interpolation and compensation stage 140 as interpolation weights in the interpolation process to adjust/correct the phases of the output signals I'(t), Q'(t), $\overline{I'(t)}$, and $\overline{Q'(t)}$.

Figure 1B:
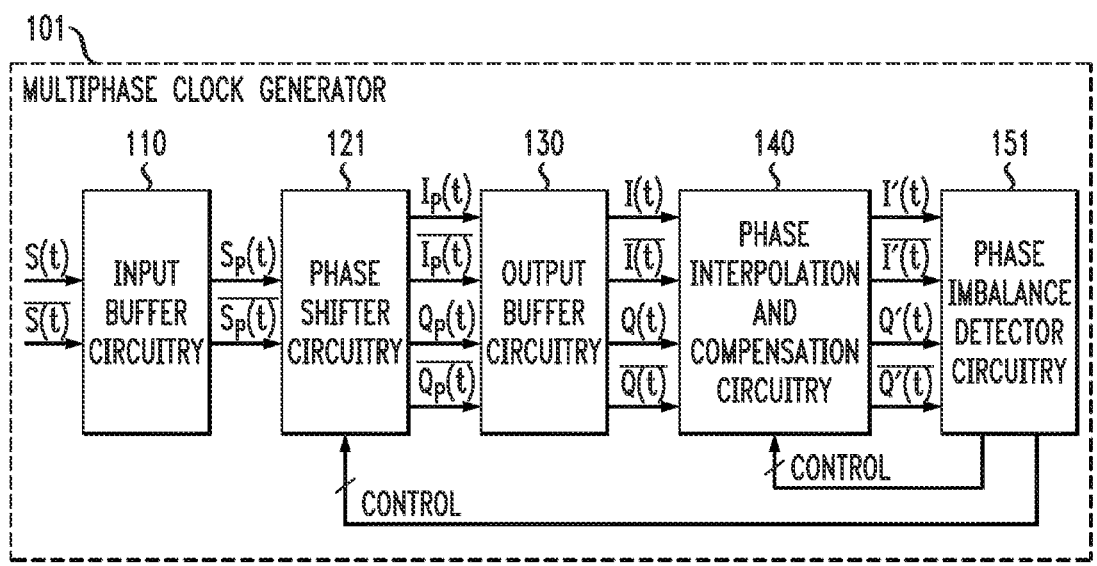
FIG. 1B schematically illustrates a multiphase clock generator according to another exemplary embodiment of the disclosure.

FIG. 1B schematically illustrates a multiphase clock generator 101 according to another exemplary embodiment of the disclosure. The multiphase clock generator 101 of FIG. 1B is similar to the multiphase clock generator 100 of FIG. 1A, except that the multiphase clock generator 101 comprises a configurable phase shifter stage 121 which has a configurable circuit framework, and a phase imbalance detector circuitry 151 which is further configured to generate control signals to configure the phase shifter circuitry 121, as needed, to provide a coarse adjustment/correction of the phases of the output signals I'(t), Q'(t), $\overline{I'(t)}$, and $\overline{Q'(t)}$. An exemplary embodiment of the configurable phase shifter stage 121 will be discussed in further detail below in conjunction with FIGS. 3A and 3B.

In the exemplary embodiment of FIG. 1B, the phase imbalance detector circuitry 151 generates digital control signals to configure the phase shifter circuitry 121 (e.g., perform capacitor trimming and/or resistor trimming operations) to provide a "coarse" adjustment/correction of the phases of the output signals I'(t), Q'(t), $\overline{I'(t)}$, and $\overline{Q'(t)}$. As explained in further detail below, the trimming operations (e.g., capacitor trimming and/or resistor trimming operations) are perform to correct for phase errors that result from process variation of constituent components (e.g., capacitors, resistors, etc.) of the configurable phase shifter circuitry 121. In addition, as in the exemplary embodiment of FIG. 1A, the phase imbalance detector circuitry 151 generates DC interpolation weight control signals that are input to the phase interpolation and compensation stage 140 as interpolation weights to control the interpolation process and thereby provide "fine" adjustment/correction of the phases of the output signals I'(t), Q'(t), $\overline{I'(t)}$, and $\overline{Q'(t)}$.

Figure 2B:
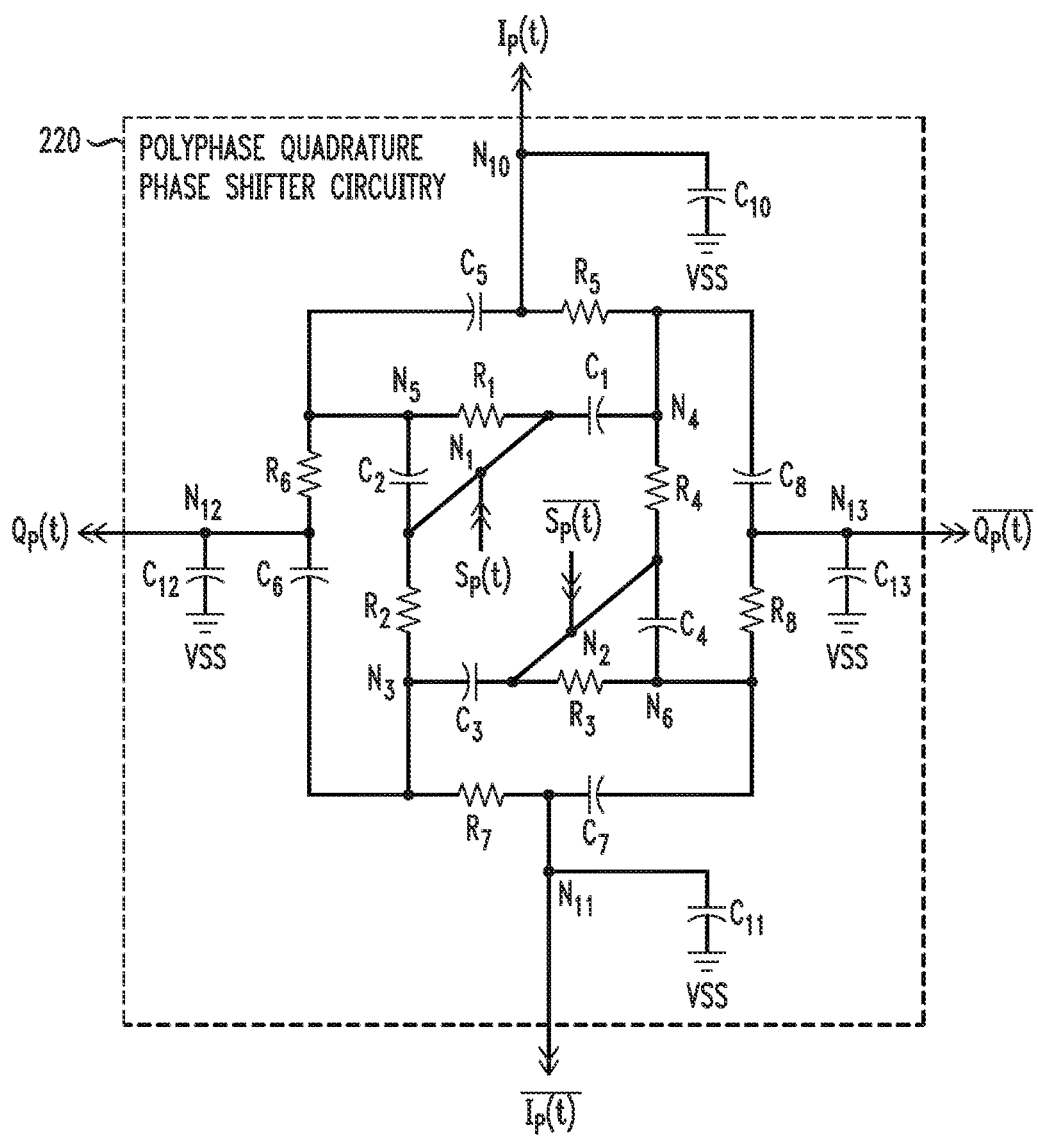
FIG. 2B schematically illustrates a quadrature polyphase phase shifter circuit according to an exemplary embodiment of the disclosure.
Figure 3A:
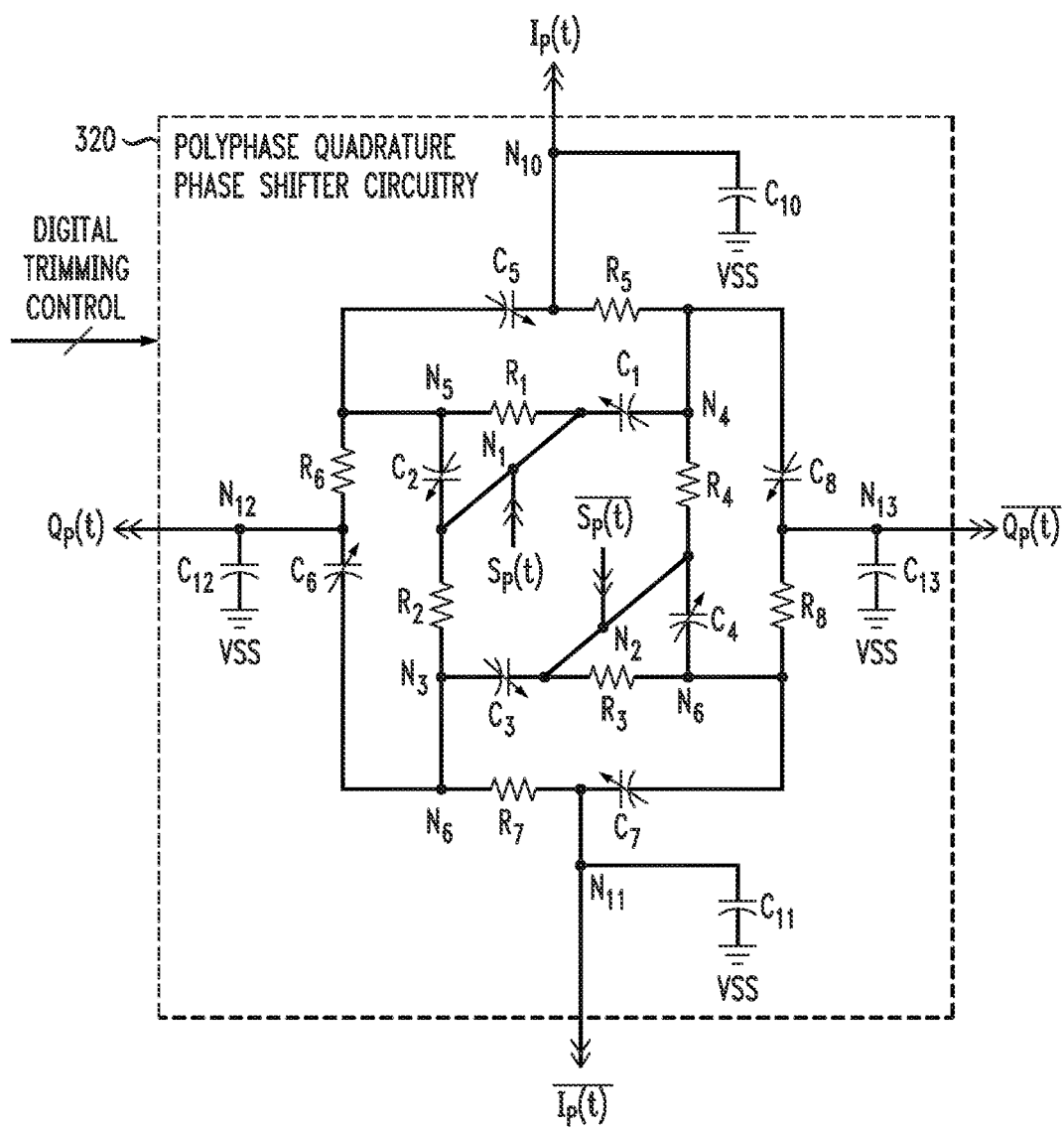
FIG. 3A schematically illustrates a configurable quadrature polyphase phase shifter circuit according to an exemplary embodiment of the disclosure.

FIG. 2A schematically illustrates a quadrature phase shifter stage of a multiphase clock generator, according to an exemplary embodiment of the disclosure. More specifically, FIG. 2A schematically illustrates a quadrature phase shifter stage 200 comprising input buffer circuitry 210, polyphase quadrature phase shifter circuitry 220, and output buffer circuitry 230. In some embodiments, the input buffer circuitry 210, the polyphase quadrature phase shifter circuitry 220, and the output buffer circuitry 230 are exemplary implementations of the input buffer circuitry 110, the phase shifter circuitry 120, and the output buffer circuitry 130 of the multiphase clock generator 100 of FIG. 1A. In some embodiments, the polyphase quadrature phase shifter circuit 220 is implement using a passive quadrature phase shifter circuit such as a polyphase filter as shown in FIGS. 2B and 3A, the details of which will be explained in further detail below.

In some embodiments, the input buffer circuitry 210 comprises a plurality of input buffers 211 and 212 which receive as input the complementary analog signals S(t) and $\overline{S(t)}$ (e.g., a differential reference clock signal). The input buffers 211 and 212 comprises source follower buffer circuits which are implemented using n-type (N) metal-oxide-semiconductor field-effect transistors (MOSFETs), or NMOS transistors. In particular, the first input buffer 211 comprises first and second NMOS transistors 211-1 and 211-2 which are serially connected between a positive supply voltage node VDD (or VDD rail), and a negative supply voltage node VSS (or VSS rail). The second input buffer 212 comprises first and second NMOS transistors 212-1 and 212-2 which are serially connected between the VDD rail and the VSS rail.

The first NMOS transistors 211-1 and 212-1 comprise gate terminals which receive the respective complementary analog signals S(t) and $\overline{S(t)}$, and source terminals connected to output nodes of the respective input buffers 211 and 212, wherein the buffers 211 and 212 output respective complementary signals $S_P(t)$ and $\overline{S_P(t)}$. In this configuration, the input buffers 211 and 212 serve as voltage buffers in which the output signals $S_P(t)$ and $\overline{S_P(t)}$ are equal to the respective input signals $S(t)$ and $\overline{S(t)}$ minus the gate-to-source ($V_{GS}$) of the NMOS transistors 211-1 and 212-1. Moreover, the second NMOS transistors 211-2 and 212-2 are configured to operate as constant current sources. In particular, the second NMOS transistors 211-2 and 212-2 comprise gate terminals which receive a same bias voltage $V_{BIAS1}$ and generate a constant quiescent bias current $I_{BIAS}$. Since the bias currents $I_{BIAS}$ of the input buffers 211 and 212 are constant, and the first NMOS transistors 211-1 and 212-1 operate in saturation mode, the $V_{GS}$ of the first NMOS transistors 211-1 and 212-1 will remain constant. In other words, with the first NMOS transistors 211-1 and 212-1 operating in saturation mode, the channel current which flows through the first NMOS transistors 211-1 and 212-1 is determined by their $V_{GS}$, and since the current $I_{BIAS}$ is held constant, the $V_{GS}$ of the first NMOS transistors 211-1 and 212-1 will remain constant.

The polyphase quadrature phase shifter circuit 220 receives the complementary analog signals $S_P(t)$ and $\overline{S_P(t)}$, which are output from the input buffer stage 210, and performs a quadrature phase shift operation to generate and output complementary analog in-phase signals $I_P(t)$ and $\overline{I_P(t)}$, and complementary analog quadrature-phase signals $Q_P(t)$ and $\overline{Q_P(t)}$. In some embodiments, the polyphase quadrature phase shifter circuit 220 is implemented using a passive quadrature phase shifter circuit such as a polyphase filter as shown in FIGS. 2B and 3A, the details of which will be explained in further detail below.

In some embodiments, the output buffer circuitry 230 comprises a plurality of output buffers 231, 232, 233, and 234 which receive as input the analog quadrature signals $I_P(t)$, $\overline{I_P(t)}$, $Q_P(t)$, and $\overline{Q_P(t)}$, respectively. The output buffers 231, 232, 233, 234 comprises source follower buffer circuits which are implemented using p-type MOSFETs, or PMOS transistors. In particular, a first output buffer 231 comprises first and second PMOS transistors 231-1 and 231-2 which are serially connected between the VDD and VSS rails. A second output buffer 232 comprises first and second PMOS transistors 232-1 and 232-2 which are serially connected between the VDD and VSS rails. A third output buffer 233 comprises first and second PMOS transistors 233-1 and 233-2 which are serially connected between the VDD and VSS rails. A fourth output buffer 234 comprises first and second PMOS transistors 234-1 and 234-2 which are serially connected between the VDD and VSS rails.

The first PMOS transistors 231-1, 232-1, 233-1, and 234-1 comprise gate terminals which receive the analog quadrature signals $I_P(t)$, $\overline{I_P(t)}$, $Q_P(t)$, and $\overline{Q_P(t)}$, respectively, and source terminals connected to output nodes of the respective output buffers 231, 232, 233, and 234, which output respective quadrature signals $I(t)$, $\overline{I(t)}$, $Q(t)$, and $\overline{Q(t)}$ to the phase interpolation and compensation stage 140. In this configuration, the output buffers 231, 232, 233, and 234 operate as voltage buffers in which the output signals $I(t)$, $\overline{I(t)}$, $Q(t)$, and $\overline{Q(t)}$ have a magnitude which is equal to the respective input signal $I_P(t)$, $\overline{I_P(t)}$, $Q_P(t)$, and $\overline{Q_P(t)}$, plus the $V_{GS}$ of the first PMOS transistors 231-1, 232-1, 233-1, and 234-1. Moreover, the second PMOS transistors 231-2, 232-2, 233-2, and 234-2 are configured to operate as constant current sources. In particular, the second PMOS transistors 231-2, 232-2, 233-2, and 234-2 comprise gate terminals which receive a same bias voltage $V_{BIAS2}$ and generate a constant quiescent bias current $I_{BIAS}$. Since the bias currents $I_{BIAS}$ of the output buffers 231, 232, 233 and 234 are constant, and the first PMOS transistors 231-1, 232-1, 233-1, and 234-1 operate in saturation mode, the $V_{GS}$ of the first PMOS transistors 231-1, 232-1, 233-1, and 234-1 will remain constant.

It is to be appreciated that the framework of the quadrature phase shifter stage 200 of FIG. 2A provides various advantages. For example, in some embodiments, the polyphase quadrature phase shifter circuitry 220 is implemented using a network of passive components (e.g., capacitors and resistors) to generate and output the analog quadrature signals $I_P(t)$, $\overline{I_P(t)}$, $Q_P(t)$, and $\overline{Q_P(t)}$ from the input complementary analog signals $S_P(t)$ and $\overline{S_P(t)}$. In this configuration, the input and output signals have the same frequency such that the quadrature output signals are generated from the complementary input signals without having to generate higher frequency signals and implement a high-speed multiphase divider circuit to generate the quadrature signals from the higher frequency input signals, as in conventional designs. In contrast, the polyphase quadrature phase shifter circuitry 220 provides a low-power circuit architecture comprising a network of passive components to generate quadrature signals from a complementary input signal, all at the same frequency.

Furthermore, the input and output buffer stages 210 and 230 provide isolation of the polyphase quadrature phase shifter circuitry 220 from input and output loads. In particular, the input buffers 211 and 212 of the input buffer stage 210 provide a high input impedance such that the input buffer stage 210 draws very little current from the buffer inputs and, thus, the input load to the input buffer stage 210 does not affect the polyphase quadrature phase shifter circuitry 220. Moreover, the input buffers 211 and 212 provide a low output impedance to the polyphase quadrature phase shifter circuitry 220 which is connected to the outputs of the input buffer stage 210, such that the output signals do not decrease under load. Similarly, the output buffers 231, 232, 233, and 234 provide a high input impedance such that the output buffer stage 230 draws very little current from the outputs of the polyphase quadrature phase shifter circuitry 220 and, thus, the output of the polyphase quadrature phase shifter circuitry 220 is essentially independent and isolated from the load (e.g., inputs to the phase interpolation stage 140) which is driven by the output buffer stage 230.

Furthermore, the input and output buffer stages 210 and 230 are configured to maintain substantially the same common mode voltage ($V_{CM}$) of the input signals $S(t)$ and $\overline{S(t)}$ and the output signals $I(t)$, $\overline{I(t)}$, $Q(t)$, and $\overline{Q(t)}$. In particular, while the common mode voltage of the signals $S_P(t)$ and $\overline{S_P(t)}$ output from the input buffer stage 210 are equal to common mode voltage of the respective input signals $S(t)$ and $\overline{S(t)}$ less the voltage $V_{GS}$ of the NMOS transistors 211-1 and 212-1, the common mode voltage of the analog complementary quadrature signals $I_P(t)$ and $\overline{I_P(t)}$, and $Q_P(t)$ and $\overline{Q_P(t)}$, are essentially increased by the voltage $V_{GS}$ of the PMOS transistors 231-1, 232-1, 233-1, and 234-1 of the output buffers 231, 232, 233, and 234. As such, the common mode voltages of the complementary analog signals $I(t)$ and $\overline{I(t)}$, and the complementary analog signals $Q(t)$ and $\overline{Q(t)}$, which are output from the output buffer stage 230, are substantially equal to the common mode voltage of the complementary analog signals $S(t)$ and $\overline{S(t)}$ which are input to the input buffer stage 210.

FIG. 2B schematically illustrates a quadrature polyphase phase shifter circuit according to an exemplary embodiment of the disclosure. In particular, FIG. 2B is a schematic circuit diagram of an exemplary implementation of the polyphase quadrature phase shifter circuitry 220 as shown in FIG. 2A, which can be utilized to implement the phase shifter circuitry 120 in the multiphase clock generator 100 of FIG. 1A, according to an exemplary embodiment of the disclosure. The polyphase quadrature phase shifter circuitry 220 implements a two-stage polyphase filter to perform a quadrature phase shift operation to generate the analog complementary quadrature signals $I_P(t)$ and $\overline{I_P(t)}$, and $Q_P(t)$ and $\overline{Q_P(t)}$, from the input complementary input signals $S_P(t)$ and $\overline{S_P(t)}$, while rejecting unwanted images. The two-stage polyphase filter comprises inputs and outputs at different phase relationships and, thus, is known as a polyphase. The polyphase filter comprises a complex filter with a magnitude response (e.g., transfer function) which is a function of both input frequency and phase. The polyphase filter comprises at least two inputs which together provide the necessary frequency and phase information, and at least two stages to obtain differential quadrature signals.

More specifically, the polyphase quadrature phase shifter circuitry 220 comprises a filter network comprising resistors $R_1$, $R_2$, $R_3$, $R_4$, $R_5$, $R_6$, $R_7$, and $R_8$, and capacitors $C_1$, $C_2$, $C_3$, $C_4$, $C_5$, $C_6$, $C_7$, and $C_8$. The polyphase quadrature phase shifter circuitry 220 comprises input nodes $N_1$ and $N_2$ which receive the input analog signals $S_P(t)$ and $\overline{S_P(t)}$, respectively. A first stage of the two-stage polyphase filter comprises RC-CR filters that are formed by the resistors $R_1$, $R_2$, $R_3$, and $R_4$ and the capacitors $C_1$, $C_2$, $C_3$, and $C_4$, and a second stage of the two-stage polyphase filter comprises RC-CR filters that are formed by the resistors $R_5$, $R_6$, $R_7$, and $R_8$ and the capacitors $C_5$, $C_6$, $C_7$, and $C_8$. The outputs of the first stage are connected to respective inputs of the second stage at nodes $N_3$, $N_4$, $N_5$, and $N_6$. As further shown in FIG. 2B, the polyphase quadrature phase shifter circuitry 220 comprises output nodes $N_{10}$, $N_{11}$, $N_{12}$, and $N_{13}$ which output the complementary quadrature signals $I_P(t)$, $\overline{I_P(t)}$, $Q_P(t)$, and $\overline{Q_P(t)}$, respectively. FIG. 2A illustrates parasitic capacitances $C_{10}$, $C_{11}$, $C_{12}$, and $C_{13}$ connected between the respective output nodes $N_{10}$, $N_{11}$, $N_{12}$, and $N_{13}$ and the VSS rail. These parasitic capacitances $C_{10}$, $C_{11}$, $C_{12}$, and $C_{13}$ represent the parasitic loading (e.g., gate-to-drain capacitance) of the output buffers 231, 232, 233, and 234 of the output buffer stage 230 (FIG. 2A). In this regard, the parasitic capacitances $C_{10}$, $C_{11}$, $C_{12}$, and $C_{13}$ are not elements of the polyphase quadrature phase shifter circuitry 220, but such parasitic capacitances do have some impact on the performance of the polyphase quadrature phase shifter circuitry 220, which should be considered.

In this configuration, the polyphase filter comprises a combination of low-pass and high-pass filters formed by complementary RC subcircuits in which the values of the capacitors and resistors are selected to achieve pole frequencies based on a target center frequency of the input signals $S_P(t)$ and $\overline{S_P(t)}$. For example, for a two-stage filter, in some embodiments, a geometric mean of the RC pole values can be selected to be substantially equal to a target center frequency. By way of example, for a two-stage polyphase filter with a center frequency of 1 GHz, the RC poles of the polyphase filter can be set to 900 MHz and 1.1 GHz. In some embodiments, the resistors $R_1$, $R_2$, $R_3$, and $R_4$ and the capacitors $C_1$, $C_2$, $C_3$, and $C_4$ in the first stage may have the same resistance and capacitance values, while the resistors $R_5$, $R_6$, $R_7$, and $R_8$ and the capacitors $C_5$, $C_6$, $C_7$, and $C_8$ in the second stage may have the same resistance and capacitance values, which are different from the resistance and capacitance values in the first stage. In some embodiments, all the capacitors are selected to have the same capacitance values, while the resistance values of the resistors across the two stages are different to achieve the desired pole values.

FIG. 2B illustrates an exemplary embodiment of a quadrature polyphase filter circuit with fixed resistors and capacitors. While CMOS processes enable the fabrication of on-chip resistors and capacitors, CMOS processes typically can only guarantee the accuracy of the resistance and capacitance values of on-chip resistors and capacitors within a relatively small percentage (e.g., within ±25%). There are various sources of variance in the absolute values of on-chip resistors and capacitors due to, e.g., process variations in the manufacturing process, temperature variations, etc. In this regard, the implementation of a quadrature polyphase filter circuit with fixed resistor and capacitor values can result in variations in the RC pole values of the polyphase filter, resulting in relatively large differences in the expected frequency response and gain of the polyphase filter, leading to signal attenuation and/or degraded quadrature precision.

In some embodiments, a configurable quadrature polyphase filter circuit is implemented in which the resistors and/or the capacitors of the polyphase filter are implemented as variable resistors and/or variable capacitors. As explained in further detail below, the values of the resistors and/or capacitors can be adjusted via a coarse trimming process under digital control, to provide coarse adjustments to account for, e.g., process variations. For example, FIG. 3A schematically illustrates a configurable quadrature polyphase phase shifter circuit according to an exemplary embodiment of the disclosure. In particular, FIG. 3A is a schematic circuit diagram of an exemplary implementation of a configurable polyphase quadrature phase shifter circuit 320 which is similar to the polyphase quadrature phase shifter circuit 220 of FIG. 2B, but where the capacitors $C_1$, $C_2$, $C_3$, $C_4$, $C_5$, $C_6$, $C_7$, and $C_8$ are implemented as variable capacitors with capacitance values that can be trimmed using digital control signals. In some embodiments, the configurable polyphase quadrature phase shifter circuit 320 is implemented in the configurable phase shifter circuitry 121 of the multiphase clock generator 101 (FIG. 1B).

Figure 3B:
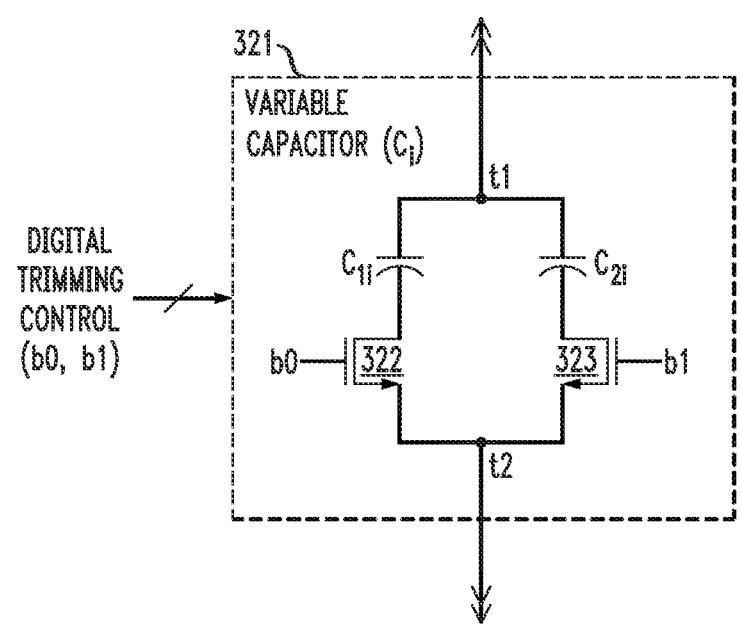
FIG. 3B schematically illustrates a circuit to implement a variable capacitor in the configurable quadrature polyphase phase shifter circuit of FIG. 3A, according to an exemplary embodiment of the disclosure.

FIG. 3B schematically illustrates a circuit to implement a variable capacitor 321 in the configurable quadrature polyphase phase shifter circuit 320 of FIG. 3A, according to an exemplary embodiment of the disclosure. As shown in FIG. 3B, the variable capacitor circuit 321 (or capacitor trimming circuit 321) comprises a first capacitor $C_{1i}$, a second capacitor $C_{2i}$, a first switch 322, and a second switch 323. In some embodiments, the first and second switches 322 and 323 are NMOS transistors. The first switch 322 and the first capacitor $C_{1i}$ are serially connected between a first terminal t1 and a second terminal t2 of the variable capacitor circuit 321. The second switch 323 and the second capacitor $C_{2i}$ are serially connected between the first and second terminals t1 and t2 of the variable capacitor circuit 321.

As further shown in FIG. 3B, a two-bit digital trimming control signal (b0, b1) is input to the variable capacitor circuit 321 to adjust a capacitance value $C_i$ of the variable capacitor circuit 321. More specifically, a first bit (b0) of the digital control signal is applied to a gate terminal of the first switch 322, and a second bit (b1) of the digital control signal is applied to a gate terminal of the second switch 323. With this exemplary circuit configuration, the first and second switches 322 and 323 can be selectively activated/deactivated via the digital trimming control signal (b0, b1) to selectively connect one or both of the first and second capacitors $C_{1i}$ and $C_{2i}$ between the first and second terminals t1 and t2.

In particular, when the first bit b0 is logic "1" and the second bit b1 is logic "0", the first switch 322 is turned on and the second switch 323 is turned off, such that only the first capacitor $C_{1i}$ is connected between the first and second terminals t1 and t2. When the first bit b0 is logic "0" and the second bit b1 is logic "1", the first switch 322 is turned off and the second switch 323 is turned on, such that only the second capacitor $C_{2i}$ is connected between the first and second terminals t1 and t2. When both bits b0 and b1 are logic "1", both switches 322 and 323 are turned on, such that the first and second capacitors $C_{1i}$ and $C_{2i}$ are connected in parallel between the first and second terminals t1 and t2. Accordingly, the capacitance value $C_i$ of the variable capacitor circuit 321 can be adjusted to one of three different capacitance values: (i) $C_{1i}$, (ii) $C_{2i}$, or (iii) $C_{3i}=C_{1i}+C_{2i}$. In some embodiments, the first capacitor $C_{1i}$ can have a nominal capacitance value which corresponds to the RC pole values of the polyphase filter as designed. The second capacitor $C_{2i}$ can have a capacitance value which is less than the capacitance value of the first capacitor $C_{1i}$ by a certain amount to enable a coarse trimming adjustment for process variation using three different capacitance values, where $C_{2i}<C_{1i}<C_{3i}$.

In some embodiments, each of the variable capacitors $C_1$, $C_2$, $C_3$, $C_4$, $C_5$, $C_6$, $C_7$, and $C_8$ in the configurable quadrature polyphase phase shifter circuit 320 of FIG. 3A can be implemented using the variable capacitance circuit 321 of FIG. 3B. In some embodiments, the same two-bit digital code (b0, b1) would be concurrently applied to each of the variable capacitors $C_1$, $C_2$, $C_3$, $C_4$, $C_5$, $C_6$, $C_7$, and $C_8$ to provide a coarse trimming operation. In such embodiments, all the capacitor values would be either increased or decreased at the same time according to the value of the two-bit digital code.

It is to be understood that the capacitor trimming circuitry and variable capacitors can be implemented using other techniques or devices such as varactor devices. However, the framework of the variable capacitor circuit 321 with the first and second switches 322 and 323 implemented as NMOS transistors provides various advantages. For example, in exemplary embodiments wherein the VDD rail is relatively small (e.g., less than 1V) and the VSS rail is at ground voltage 0V, the voltage levels (e.g., common mode voltage) of the complementary analog signals $S_P(t)$ and $\overline{S_P(t)}$ (which are input to the configurable quadrature polyphase phase shifter circuit 320) are relatively small and close to VSS. These low voltage levels allow for the use of the NMOS transistors as switches 322 and 323 to implement the variable capacitor circuit 321, while achieving a high quality factor for the polyphase filter, and the low parasitic capacitances and resistances of the NMOS transistors have a very small, and insignificant impact on the phase and frequency response of the polyphase filter circuit.

The exemplary embodiments of FIGS. 3A and 3B illustrate techniques to utilize variable capacitors for the polyphase filter of the configurable quadrature polyphase phase shifter circuit 320 to implement coarse trimming functions to essentially render the quadrature phase shifter circuitry process invariant. In this regard, coarse trimming of the capacitor values can be implemented to adjust the phase and frequency response of the polyphase filter due to process variations in the resistance values and capacitance values of the polyphase filter.

In other embodiments, the same or similar techniques shown in FIG. 3B can be utilized to implement variable resistors, wherein the first and second capacitors $C_{1i}$ and $C_{2i}$ in FIG. 3B are replaced with first and second resistors $R_{1i}$ and $R_{2i}$ to thereby generate a resistor trimming circuit using the first and second switches 322 and 323. Accordingly, in such configuration, the resistance value $R_i$ of the variable resistor circuit can be adjusted to one of three different resistance values: (i) $R_{1i}$, (ii) $R_{2i}$, or (iii)

$$R_{3i} = (1/R_{1i} + 1/R_{2i})^{-1}.$$

In some embodiments, the first resistor $R_{1i}$ can have a nominal resistance value which corresponds to the RC pole values of the polyphase filter as designed. The second resistor $R_{2i}$ can have a resistance value which is greater than the resistance value of the first resistor Rh by a certain amount to enable a coarse trimming adjustment for process variation using three different resistance values, where $R_{3i}<R_{1i}<R_{2i}$.

In some embodiments, each of the resistors $R_1$, $R_2$, $R_3$, $R_4$, $R_5$, $R_6$, $R_7$, and $R_8$ can be implemented as digitally controlled variable resistors using a resistor trimming circuit based on the architecture of FIG. 3B. With digitally controlled variable resistors, trimming of the resistance values of the variable resistors can be implemented to adjust (e.g., coarse adjustment) the phase and frequency response of the polyphase filter due to variations in the resistance values and capacitance values of the polyphase filter. In other embodiments, all resistor and capacitor elements of the polyphase filter can be implemented as variable elements that are digitally controlled to adjust (e.g., coarse adjustment) the phase and frequency response of the polyphase filter. In such embodiments, a first digital signal (e.g., two-bit signal) would be used to control the variable capacitors, while a second digital signal (e.g., two-bit signal) would be used to control the variable resistors.

Figure 4C:
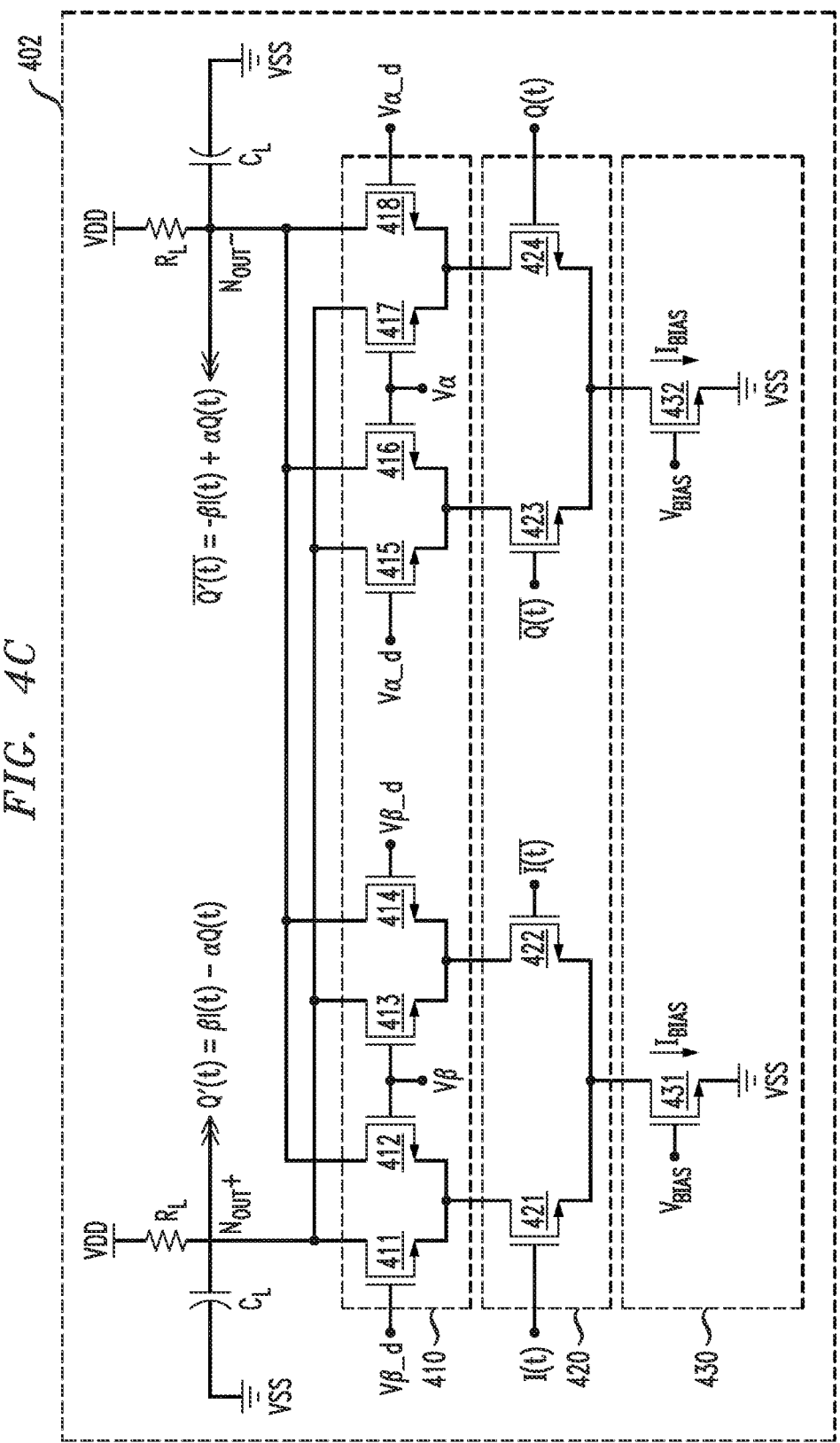
FIG. 4C is a schematic circuit diagram of a second phase interpolation cell of the phase interpolator of FIG. 4A, according to an exemplary embodiment of the disclosure.

FIGS. 4A, 4B, and 4C schematically illustrate a phase interpolator according to an exemplary embodiment of the disclosure. In particular, FIG. 4A schematically illustrates a phase interpolator 400 comprising a plurality of phase interpolation cells including a first phase interpolation cell 401 and a second phase interpolation cell 402. FIG. 4B is a schematic circuit diagram of the first phase interpolation cell 401 according to an exemplary embodiment of the disclosure, and FIG. 4C is a schematic circuit diagram of the second phase interpolation cell 402, according to an exemplary embodiment of the disclosure. It is to be understood that FIGS. 4A, 4B, and 4C illustrate an exemplary implementation of the phase interpolation and compensation circuitry 140 of the multiphase clock generators 100 and 101 shown in FIGS. 1A and 1B.

Referring to FIG. 4A, the first and second phase interpolation cells 401 and 402 have a same circuit architecture comprising load elements $R_L$ coupled to the output nodes $N_{OUT}^+$ and $N_{OUT}^-$, phase compensation circuitry 410 (or phase compensation stage), current steering circuitry 420 (or current steering stage), and tail current source circuitry 430. The first phase interpolation cell 401 generates the phase-adjusted complementary analog in-phase signals I'(t) and $\overline{I'(t)}$ at the respective output node $N_{OUT}^+$ and $N_{OUT}^-$, where $I'(t)=\alpha I(t)+\beta Q(t)$, and where $\overline{I'(t)}=-\alpha I(t)-\beta Q(t)$. The second phase interpolation cell 402 generates the phase-adjusted complementary analog quadrature-phase signals Q'(t) and $\overline{Q'(t)}$ at the respective output node $N_{OUT}^+$ and $N_{OUT}^-$, where $Q'(t)=\beta I(t)-\alpha Q(t)$, and where $\overline{Q'(t)}=-\beta I(t)+\alpha Q(t)$.

The tail current source circuitry 430 is configured to generate a constant quiescent bias current ($I_{BIAS}$) for operation of the first and second phase interpolation cells 401 and

402. The current steering circuitry 420 comprises an input stage to receive the complementary analog in-phase signals I(t) and $\overline{I(t)}$ (CLK_0 and CLK_180), and the complementary analog quadrature-phase signals Q(t) and $\overline{Q(t)}$ (CLK_90 and CLK_270). The current steering circuitry 420 comprises a plurality of differential pairs of transistors which are configured to divide (or steer) the total current ($I_{BIAS}$) that flow through the resistive loads $R_L$ based on the complementary input signals I(t) and $\overline{I(t)}$, and Q(t) and $\overline{Q(t)}$ signals, to thereby generate the phase-adjusted complementary output I'(t) and $\overline{I'(t)}$, and Q'(t) and $\overline{Q'(t)}$ at the respective output node $N_{OUT}^+$ and $N_{OUT}^-$ of the first and second interpolation cells 401 and 402.

The phase compensation circuitry 410 receives as input a plurality of DC interpolation weight voltages Vα, Vα_d, Vβ, and Vβ_d, which correspond to scalar weights α and β (or interpolation coefficients α and β) that are utilized for fine adjustment of the phases of the output signals that are generated by the phase interpolation process. In this regard, the phase compensation circuitry 410 comprises an interpolator weight control stage which is configured to apply the scalar weights α and β to the complementary input signals I(t) and $\overline{I(t)}$, and Q(t) and $\overline{Q(t)}$ signals in a controlled manner to thereby interpolate between combinations of the complementary input signals and generate the phase-adjusted complementary output signal I'(t) and $\overline{I'(t)}$, and Q'(t) and $\overline{Q'(t)}$, which comprises weighted summations of the phases of complementary input signals.

The DC weight voltages Vα and Vα_d are essentially first complementary interpolation weight voltages which are used to implement the α weights for the phase interpolation and compensation process. Similarly, the DC voltages Vβ and vβ_d are essentially second complementary interpolation weight voltages which are used to implement the β weights for the phase interpolation and compensation process. Essentially, the DC weight voltages Vα, Vα_d, Vβ, and vβ_d comprise "up and down" voltage signals which increase or decrease around a common DC voltage $V_{DC}$. For example, Vα=$V_{DC}$+ΔV and Vα_d=$V_{DC}$-ΔV, and Vβ=$V_{DC}$+ΔV and Vβ_d=$V_{DC}$-ΔV. The interpolation weight voltages are complementary (or differential) in the sense that (i) the first complementary interpolation weight voltages Vα and Vα_d increase and decrease by the same ΔV, and that (ii) the second complementary interpolation weight voltages Vβ and Vβ_d increase and decrease by the same ΔV. The interpolation weight voltages Vα, Vα_d, Vβ, and Vβ_d have the same common DC voltage $V_{DC}$, while the ΔV values for the interpolation weights α and β can be different at any given time.

By way of example, assume that VDD=1.0V, VSS=0V, $V_{DC}$=550 mV, and a step size of 12.5 mV. When the DC weight voltage Vα is set at Vα=$V_{DC}$+100 mV=650 mV, the DC weight voltage Vα_d will be set at Vα_d=$V_{DC}$-100 mV=450 mV. It is to be understood that the number of steps and the step size will vary depending on various factors such as the amount of phase adjustment resolution that is desired for a given application, the supply voltage rail levels, etc. For example, in some embodiments, the DC weight voltages Vα, Vα_d, Vβ, and Vβ_d can each have 16 steps of 12.5 mV each, which results in a maximum ±ΔV of 200 mV, and thus a 400 mV difference (e.g., 750 mV-350 mV) between Vα and Vα_d or between Vβ and Vβ_d. In some embodiments, the maximum voltage difference between Vα and Vα_d or between Vβ and Vβ_d is selected to be about 25% of the VDD voltage level (assuming VSS=0). For example, for a positive supply voltage VDD=1V, the maximum voltage difference would be 250 mV, which results in a maximum ±ΔV of 125 mV.

Referring to FIG. 4B, an exemplary implementation of the first phase interpolation cell 401 is shown. The first phase interpolation cell 401 comprises a current-mode phase interpolator framework in which the phase-adjusted complementary output signals I'(t) and $\overline{I'(t)}$ are generated at respective first and second output nodes $N_{OUT}^+$ and $N_{OUT}^-$ based on current flow through the passive load resistors $R_L$. The first phase interpolation cell 401 comprises a passive resistive load circuit which comprises the resistors $R_L$ coupled between the VDD supply rail and the respective first and second output nodes $N_{OUT}^+$ and $N_{OUT}^-$. The load resistors $R_L$ are designed to be identical and have the same or substantially the same resistance value. FIG. 4B illustrates parasitic load capacitances $C_L$ connected between the respective first and second output nodes $N_{OUT}^+$ and $N_{OUT}^-$ and the VSS supply rail. These parasitic load capacitances $C_L$ represent the parasitic loading of the downstream stage to which the output nodes $N_{OUT}^+$ and $N_{OUT}^-$ are connected.

As further shown in FIG. 4B, the phase compensation circuitry 410 comprises a plurality of transistors 411, 412, 413, 414, 415, 416, 417, and 418. In some embodiments, the transistors 411, 412, 413, 414, 415, 416, 417, and 418 are NMOS transistors. The transistors 411 and 412 comprise a first differential transistor pair having commonly connected source terminals, and respective gate terminals which receive respective interpolation weight voltages Vα_d and Vα. The transistor 411 comprises a drain terminal that is coupled to the output node $N_{OUT}^+$ while the transistor 412 comprises a drain terminal that is coupled to the output node $N_{OUT}^-$. The transistors 413 and 414 comprise a second differential transistor pair having commonly connected source terminals, and respective gate terminals which receive respective interpolation weight voltages Vα and Vα_d. The transistor 413 comprises a drain terminal that is coupled to the first output node $N_{OUT}^+$, while the transistor 414 comprises a drain terminal that is coupled to the second output node $N_{OUT}^-$.

Furthermore, the transistors 415 and 416 comprise a third differential transistor pair having commonly connected source terminals, and respective gate terminals which receive respective interpolation weight voltages Vβ_d and Vβ. The transistor 415 comprises a drain terminal that is coupled to the first output node $N_{OUT}^+$, while the transistor 416 comprises a drain terminal that is coupled to the second output node $N_{OUT}^-$. The transistors 417 and 418 comprise a fourth differential transistor pair having commonly connected source terminals, and respective gate terminals which receive respective interpolation weight voltages Vβ and Vβ_d. The transistor 417 comprises a drain terminal that is coupled to the first output node $N_{OUT}^+$, while the transistor 418 comprises a drain terminal that is coupled to the second output node $N_{OUT}^-$.

The current steering circuitry 420 comprises a plurality of transistors 421, 422, 423, and 424. In some embodiments, the transistors 421, 422, 423, and 424 are NMOS transistors. The transistors 421 and 422 comprise a first differential transistor pair having commonly connected source terminals, and respective gate terminals which receive respective complementary analog in-phase signals I(t) and $\overline{I(t)}$. The transistor 421 comprises a drain terminal that is coupled to the commonly connected source terminals of the first differential transistor pair 411/412 of the phase compensation circuitry 410, while the transistor 422 comprises a drain terminal that is coupled to the commonly connected source terminals of the second differential transistor pair 413/414 of the phase compensation circuitry 410. The transistors 423 and 424 comprise a second differential transistor pair having commonly connected source terminals, and respective gate terminals which receive respective complementary analog quadrature-phase signals Q(t) and $\overline{Q(t)}$. The transistor 423 comprises a drain terminal that is coupled to the commonly connected source terminals of the third differential transistor pair 415/416 of the phase compensation circuitry 410, while the transistor 424 comprises a drain terminal that is coupled to the commonly connected source terminals of the fourth differential transistor pair 417/418 of the phase compensation circuitry 410.

The tail current source circuitry 430 comprises a plurality of transistors 431 and 432 which, in some embodiments, are NMOS transistors. The transistors 431 and 432 are configured to operate as constant current sources (e.g., current sinks), wherein the transistors 431 and 432 have gate terminals which receive a same bias voltage $V_{BIAS}$ and generate a same quiescent current $I_{BIAS}$ in the different stages/branches of the first phase interpolation cell 401. As shown in FIG. 4B, the transistor 431 has a drain terminal which is coupled to the commonly connected source terminals of the first differential transistor pair 421/422 of the current steering circuitry 420, and a source terminal that is coupled to the VSS supply rail. The transistor 432 has a drain terminal which is coupled to the commonly connected source terminals of the second differential transistor pair 423/424 of the current steering circuitry 420, and a source terminal that is coupled to the VSS supply rail.

With the exemplary framework of the first phase interpolation cell 401, the total current $I_{BIAS}$ in each of the branches/stages of the first phase interpolation cell 401 is constant. However, the total current $I_{BIAS}$ in the branch/stages of the first phase interpolation cell 401 will be divided between the first differential transistor pair 421/421 and the second differential pair 423/424 based on the interpolation weights α and β that are applied as the DC weight voltages Vα and Vα_d to the gate terminals of the transistors 411, 412, 413, and 414 of the phase compensation circuitry 410, and as DC weight voltages Vβ and Vβ_d to the gate terminals of the transistors 415, 416, 416, and 417 of the phase compensation circuitry 410. The DC weight voltages Vα and Vα_d, and Vβ and Vβ_d are controlled to provide the desired contributions of the input signals I(t), $\overline{I(t)}$, Q(t), $\overline{Q(t)}$ to thereby generate the desired phase of the complementary phase-adjusted output signals I'(t) and $\overline{I'(t)}$.

In the exemplary embodiment of FIG. 4B, the phase compensation stage 410 essentially performs a "static" current steering function in which the amount of current that flows through the transistors of the differential transistor pairs 411/412, 413/414, 415/416, and 417/418 of the phase compensation stage 410 will be statically divided based on the differential DC weight voltages Vα and Vα_d and Vβ and Vβ_d that are applied to the gate terminals of the differential transistor pairs 411/412, 413/414, 415/416, and 417/418. On the other hand, the current steering stage 420 essentially performs a "dynamic" current steering function in which the amount of current that flows through the transistors of the differential transistor pairs 421/422 and 423/424 of the current steering stage 420 will be dynamically divided and continually changing based on the input analog signals I(t), $\overline{I(t)}$, Q(t), and $\overline{Q(t)}$ applied to the gate terminals of the differential transistor pairs 421/422 and 423/424.

Referring to FIG. 4C, an exemplary implementation of the second phase interpolation cell 402 is shown. The second phase interpolation cell 402 comprises a current-mode phase interpolator framework which has the same circuit framework as the first phase interpolation cell 401, but wherein the input analog signals and the DC weight voltages are applied to different ones of the differential transistor pairs to generate the phase-adjusted complementary output signal Q'(t) and $\overline{Q'(t)}$ at the respective output nodes $N_{OUT}^+$ and $N_{OUT}^-$ of the second phase interpolation cell 402. More specifically, as shown in FIG. 4C, the DC weight voltages Vβ and Vβ_d are applied to respective gate terminals of the first differential transistor pair 411/412 and the second differential transistor pair 413/414 of the phase compensation circuitry 410, while the DC weight voltages Vα and Vα_d are applied to respective gate terminals of the third differential transistor pair 415/416 and the fourth differential transistor pair 417/418 of the phase compensation circuitry 410. In addition, in the current steering circuitry 420, the input signal Q(t) is applied to the gate terminal of the transistor 424, while the signal $\overline{Q(t)}$ is applied to the gate terminal of the transistor 423.

It is to be appreciated that the exemplary phase interpolar framework as shown in FIGS. 4A, 4B, and 4C provides a novel and advantageous implementation of a current-mode phase interpolator circuit in which the interpolation coefficients are realized using the DC weight voltages Vα and Vα_d, and Vβ and Vβ_d that are applied to gate terminals of the transistors of the phase compensation circuitry 410. This is in contrast to conventional schemes of current-mode phase interpolator circuits in which the interpolation coefficients are realized using current DACs to controllably adjust a tail current, wherein changing the tail current leads to adjustment of the tail transistors, etc. In such conventional schemes, the interpolation weights are essentially injected in the series signal paths, which can adversely impact the dynamic performance of the phase interpolation circuit. In contrast, the exemplary embodiments of the current mode phase interpolators as shown in FIGS. 4A, 4B, and 4C adjust the interpolation coefficients by changing DC weight voltages that are applied to gate terminals of the transistors of the phase compensation circuitry. In this regard, since the DC weight voltages are applied to the gate terminals, such voltages do not appear in the series signal paths and, thus, do not impact the dynamic performance of the phase interpolator circuit.

FIG. 5 is a flow diagram of a method for calibrating a multiphase clock generator according to an exemplary embodiment of the disclosure. In particular, in some embodiments, FIG. 5 illustrates modes of operation of the phase imbalance detector circuitry 150 and 151 (or control circuits 150 and 151) shown in FIGS. 1A and 1B to enable (i) coarse phase adjustments by performing trimming operations via digital control of the configurable phase shifter circuitry 121, and (ii) fine phase adjustments by adjusting the values of the DC weight voltages that are applied to the phase interpolation and compensation stage 140.

Referring to FIG. 5, in some embodiments, a calibration process begins (block 500) on power-up of a multiphase clock generator (block 500). In exemplary embodiments where the multiphase clock generator comprises a configurable quadrature phase shifter circuit (such as shown in, e.g., FIGS. 1A, 3A and 3B), a coarse phase adjustment is initially performed by performing trimming operations to change values of the variable capacitance and/or variable resistor elements to adjust a phase and frequency response of the quadrature phase shifter circuit. As part of this initial coarse calibration process, the control circuit will set the coarse and fine control signals to mid-code levels (block

501). For example, with regard to the initial calibration of the configurable quadrature phase shifter circuit, the variable capacitor and/or resistor elements can be set to have the nominal capacitance and resistance values which correspond to the RC pole values of the polyphase filter as designed with the excepted frequency and phase response. For the fine control signals applied to the phase interpolator circuit, the DC weight voltages Vα, Vα_d, Vβ, and Vβ_d can be initially set to their common DC voltage level $V_{DC}$.

The control circuit will then apply the initial control signals to the multiphase clock signal generator circuitry and determine an amount of phase imbalance that exists as a result of the current calibration (block 502). For example, as noted above, in some embodiments, the control circuit (e.g., detector 151, FIG. 1B) will compute a scalar product of the of the quadrature analog signals I'(t) and Q'(t) which are output from the phase interpolator circuit to determine an amount of phase error. If a minimum phase error has not been reached (negative determination in block 503), the control circuit will adjust the coarse (digital) control signal using a binary search (block 504). The binary search can be performed using any suitable search algorithm, such as a half-interval search, a logarithmic search, etc., or any suitable search algorithm that finds a target code value (e.g., digital code value for coarse trimming) among a plurality of different code values. In an exemplary embodiment such as shown in FIG. 3B, where a 2-bit digital code is utilized to select one or three possible capacitance values, the search process (block 504) can be as simple as selecting the digital code which is higher or lower than the mid-level digital code such that only three iterations of the coarse calibration control process (blocks 502, 503 and 504) would be needed to determine the minimum phase error that can be achieved using the coarse trimming operations to adjust for process variations.

Next, when the minimum phase error for the coarse adjustment has been achieved (affirmative determination in block 503), the process continues with fine calibration control process (blocks 505, 506 and 507). In embodiments of a multiphase clock generator (e.g., FIG. 1A) that implement a non-configurable quadrature polyphase filter circuit (e.g., FIG. 2B), the control circuit (e.g., detector 150) would implement the fine calibration control process (blocks 505, 506 and 507) upon power up of the multiphase clock generator and on a continual basis during normal operation.

With the fine calibration process, the control circuit would determine an amount of phase imbalance that exists as a result of a current calibration (block 505). For example, as noted above, in some embodiments, the control circuit (e.g., detector 150, FIG. 1A) will compute a scalar product of the of the quadrature analog signals I'(t) and Q'(t) which are output from the phase interpolator circuit to determine an amount of phase error. If a minimum phase error has not been achieved (negative determination in block 506), the control circuit will adjust the fine control code, which corresponds to the DC weight voltages, using a binary search (block 507). For example, wherein the fine control signals comprise the DC weight voltages Vα, Vα_d, Vβ, and Vβ_d, the mid-level code for the DC weight voltages Vα, Vα_d, Vβ, and Vβ_d would be $V_{DC}$, and wherein the fine control code would be adjusted by increasing and decreasing the DC weight voltages Vα, Vα_d, Vβ, and Vβ_d by the same ΔV. Again, the binary search can be performed using any suitable search algorithm, such as a half-interval search, a logarithmic search, etc., or any suitable search algorithm that finds a target code value (e.g., ΔV value for fine control) among a plurality of different code values. In an exemplary embodiment where there are 32 or 64 different steps, the use of the binary search process can expedite the fine calibration control process. Once a minimum phase error is achieved for the fin control process (affirmative determine in block 506), the calibration process is complete (block 508).

While FIGS. 4A, 4B, and 4C illustrate an exemplary architecture of a current mode phase interpolator circuit to generate phase-corrected complementary quadrature IQ signals, (i.e., phases of 0° and 90° of a reference signal), it is to be understood that the current mode phase interpolator architectures of FIGS. 4A, 4B, and 4C can be configured to generate N different phases of an input reference signal. For example, FIG. 6 is a waveform diagram 600 which shows multiple waveform signals V1, V2, V3 and V4 having a same frequency (e.g., 6.25 GHz) and different phases of 0°, 45°, 90°, and 135°, respectively, which can be generated by a multiphase clock generator system, according to an exemplary embodiment of the disclosure.

The waveform signals V1 (0° phase) and V3 (90° phase) as shown in FIG. 6 can be generated using the two phase interpolation cells 401 and 402 of the phase interpolator 400 shown in FIGS. 4A, 4B, and 4C. It is to be understood that for ease of illustration, FIG. 6 only shows the waveforms V1, V2, V3 and V4, and not the respective complements $\overline{V1}$, $\overline{V2}$, $\overline{V3}$, and $\overline{V4}$. The waveform signals V2 (45° phase) and V4 (135° phase) (and respective complements $\overline{V2}$ and $\overline{V4}$) can be generated using two additional phase interpolation cells having the same architecture of the phase interpolation cells 401 and 402 as shown in FIGS. 4B and 4C. However, the complementary input signals I(t), $\overline{I(t)}$, Q(t), $\overline{Q(t)}$ would be applied to the gate terminals of the transistors 421, 422, 423, and 424 in the current steering stages 420 of the two additional phase interpolation cells in such a way as needed to combine and interpolate such signals to achieve the output complementary signal waveforms with the target phases, i.e., waveform V2 (45° phase) and V4 (135° phase), while implementing the necessary scaling via the DC weight voltages to correct for any phase error of the 45° and 135° phases.

As shown in FIG. 6, the four phases (N=4) have the same frequency and amplitude but with different phases. The waveforms V1, V2, V3 and V4 have the same common mode voltage $V_{CM}$ (or average DC voltage), and have substantially the same voltage swing between a maximum peak voltage (Vmax) and a minimum peak voltage (Vmin). The Vmax and Vmin voltages of the output signals V1, V2, V3 and V4 are essentially based on the resistance value of the load resistor $R_L$ as the output nodes of the phase interpolation cells, and the magnitude of the bias current $I_{BIAS}$ that is generated by the tail current sources of the tail current circuitry 410 of the phase interpolation cells.

Figure 7:
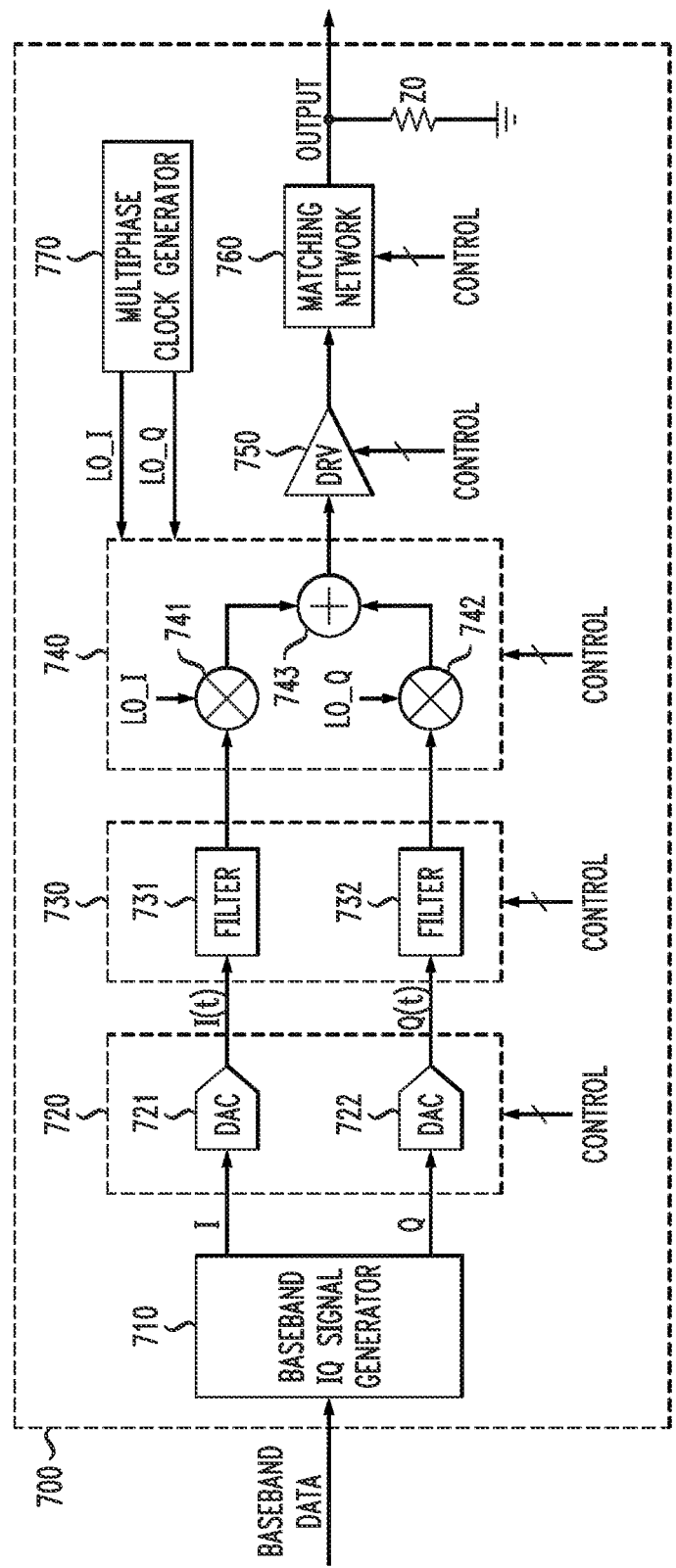
FIG. 7 illustrates a transmitter which implements a multiphase clock generator to generate complementary quadrature local oscillator (LO) signals, according to an exemplary embodiment of the disclosure.

FIG. 7 illustrates a transmitter 700 which implements a multiphase clock generator to generate complementary quadrature local oscillator (LO) signals, according to an exemplary embodiment of the disclosure. In particular, FIG. 7 schematically illustrates a single-channel transmitter 700 which comprises a baseband signal generator 710, a digital-to-analog converter stage 720 (or DAC stage 720), a filter stage 730, a modulation stage 740, an amplifier driver stage 750, an impedance matching network 760, and a multiphase clock generator 770. The DAC stage 720 comprises inputs that are coupled to outputs of the baseband signal generator 710. The filter stage 730 comprises inputs that are coupled to outputs of the DAC stage 720. The modulation stage 740 comprises inputs that are coupled to outputs of the filter stage 730. The amplifier driver stage 750 comprises an input that is coupled to an output of the modulation stage 740, and an output that is coupled to an input of the matching network 760. The matching network 760 comprises an output that is connected to an output node of the transmitter 700. In some embodiments, the output of the transmitter 700 is coupled to an antenna system which is configured to transmit an RF output signal that is generated by the transmitter 700. In other embodiments, the transmitter 700 comprises a waveform generator (e.g., an arbitrary waveform generator, or a function generator) in which the output of the transmitter 700 is coupled to an input of a sensor device, wherein the RF output signal that is generated by the transmitter 700 is configured to excite the sensor device.

As further shown in FIG. 7, the various signal processing stages 720, 730, 740, 750, and 760 of the transmitter 700 comprise control signal input ports that receive digital control signals from a microcontroller which is configured to control operation of the transmitter 700. In some embodiments, some or all of the stages 720, 730, 740, 750, and 760 have a configurable hardware framework in which various operating parameters of the stages can be adjusted by the digital control signals. Furthermore, in some embodiments, the active components of the various signal processing stages have control circuitry that is configured to control powering up and powering down of circuit blocks in the signal processing stages in response to the digital control signals to thereby selectively activate circuit blocks of the signal processing stages for different operating modes of the transmitter 700. In some embodiments, the control circuitry for controlling the powering up and the powering down circuit blocks of the signal processing stages can be implemented using an open drain circuit topology, as is known in the art. In other embodiments, circuit blocks of the signal processing stages can be powered up or powered down by implementing switching circuitry that is configured to control the flow of quiescence current (or operating current) of active components of the various circuit blocks such that a given circuit block can be powered down by cutting off the flow operating current.

In the context of the exemplary embodiments discussed herein, an RF signal comprises a signal which has a frequency ranging from, e.g., about 20 kHz to about 300 GHz, such that the energy of oscillating signals (e.g., current signals) at RF frequencies can radiate from a conductor into space as radio waves. In some embodiments, the transmitter system 700 comprises a quadrature transmitter which is configured to process quadrature signals (referred to as IQ signals). As is known in the art, a quadrature signal comprises an in-phase (I) signal component, and a quadrature-phase (Q) signal component. A pair of signals that are in quadrature have the same frequency but differ in phase by 90 degrees. For illustrative purposes, exemplary embodiments of the disclosure will be described in the context of quadrature transmitter systems, although the exemplary signal processing circuitry and methods as discussed herein can be implemented with other types of transmitters and modulation techniques.

FIG. 7 illustrates an exemplary embodiment in which the transmitter 700 comprises an RF analog quadrature transmitter. The baseband signal generator 710 is configured to receive baseband data as input (e.g., sensor data) and generate digital quadrature signals I and Q which represent the input baseband data. In this process, the baseband data that is input to the baseband signal generator 710 is separated into two orthogonal digital components including an in-phase (I) baseband component and a quadrature-phase (Q) baseband component. In some embodiments, the baseband signal generator 710 implements digital signal processing techniques based on a combination of hardware and software to generate the digital quadrature baseband signals I and Q.

In some embodiments, the input baseband data comprises digital baseband data which is generated by another signal processor that is configured to process output signals from sensor devices and generate the baseband data. In other embodiments, the functions of the baseband signal generator 710 can be implemented in a separate digital signal processor which perform various functions including, but not limited to, digital signal processing the sensor data received from the sensor and generating the digital quadrature baseband IQ signals. In this regard, while the exemplary embodiment of FIG. 7 illustrates the baseband signal generator 710 as a component of the transmitter 700, it is to be understood that in other embodiments, the baseband signal generator 710 is a system component (e.g., digital signal processor) that is separate from the transmitter 700. In other embodiments, where the transmitter 700 is implemented as a waveform generator, the baseband signal generator 710 will generate the requisite digital quadrature baseband IQ signals which are needed to generate an analog waveform (e.g., sinusoidal voltage waveform) with a target center frequency that is configured to operate or otherwise excite a sensor device that is coupled to the output of the transmitter.

The DAC stage 720 is configured to convert a digital baseband signal (e.g., a digital IQ signal output from the baseband signal generator 710) to an analog baseband signal having a baseband frequency. The DAC stage 720 comprises a first DAC circuit 721 and a second DAC circuit 722. The first DAC circuit 721 is configured to convert the digital baseband component I to an analog baseband component I(t) having a baseband frequency, and the second DAC circuit 722 is configured to convert the digital baseband component Q to an analog baseband component Q(t) having the same baseband frequency, but phase-shifted by 90 degrees relative to I(t). The DAC stage 720 generates and outputs the analog baseband signals I(t) and Q(t) at a given sampling rate ($f_S$) or sampling frequency which, in some embodiments, is in a range of baseband frequencies of about 100 kHz to about 100 MHz.

Based on the Nyquist Sampling Theorem, the highest fundamental output frequency $f_O$ signal a DAC with sampling frequency $f_S$ can generate is equal to half the sampling rate or $f_S/2$ (referred to as the first Nyquist zone). In the frequency domain, when generating a sinusoidal waveform of frequency $f_O$, the fundamental baseband frequency $f_O$ will appear as a spectral component at $f_O$, and there will be additional higher frequency components that are generated at the output of the DAC stage 720, which are referred to as "images" and which are a function $f_S$ and $f_O$. For example, the higher frequency components are determined as $|n \times f_S \pm f_O|$, where n=1, 2, 3, .... The images have the same information content as the fundamental spectral components, but at higher frequencies and at smaller amplitudes. The unwanted images are suppressed/rejected using, e.g., the downstream filter stage 730.

In some embodiments, the first and second DAC circuits 721 and 722 implement a configurable hardware framework in which various operating parameters of the DAC stage 720 can be adjusted by digital control through, e.g., the digital control signals that are input to the DAC stage 720. For example, in some embodiments, the digital control can be utilized to adjust DAC operating parameters including, but not limited to, the sampling rate, analog output gain, etc. In this regard, the first and second DAC circuits 721 and 722 can be configured to have a desired gain and sampling frequency to achieve a desired RF transmission power and RF transmission frequency when, for instance, the transmitter 700 is operating in a baseband transmission mode in which the modulation stage 740 is not operable and utilized to upconvert the baseband frequency to a higher RF transmission frequency, as discussed in further detail below.

For example, a higher DAC sampling frequency can be utilized as needed to transmit baseband data and/or relax the filter response of the downstream filters of the filter stage 730. Indeed, an increase in the DAC sampling frequency results in the possibility of accommodating higher baseband transmission frequency (i.e., the analog baseband components I(t) and Q(t) have a higher baseband frequency). In addition, an increase in the DAC sampling frequency results in an increase in the separation between the center frequency $f_O$ of the baseband component and the center frequencies $f_S \pm f_O$ of the higher frequency images, which relaxes the required sharpness of filter cutoffs at corner frequencies of the filters. However, the higher DAC sampling rate results in increased power consumption. So, a tradeoff in power consumption with lower DAC sampling frequency, and the sharpness of the filter cutoffs at the corner frequencies of the filters are factors that are considered.

The filter stage 730 is configured to the filter the IQ analog signal components output from the DAC stage 720 to thereby generate filtered analog IQ signals. The filter stage 730 comprises a first filter circuit 731 and a second filter circuit 732. The first filter circuit 731 is configured to filter the in-phase analog signal I(t) output from first DAC circuit 721, and the second filter circuit 732 is configured to filter the quadrature-phase analog signal Q(t) output from the second DAC circuit 722. In some embodiments, the first and second filter circuits 731 and 732 comprise low-pass filters that are configured to pass the fundamental spectral components of the respective analog signals I(t) and Q(t), while suppressing the image components of the respective analog signals I(t) and Q(t).

In other embodiments, the first and second filter circuits 731 and 732 can be configured as bandpass filters to pass a desired band of higher frequency image components of the respective analog baseband components I(t) and Q(t), while suppressing the fundamental spectral components and other image components of the respective analog baseband components I(t) and Q(t). In other embodiments, the first and second filter circuits 731 and 732 are configured as highpass filters, as may be desired for a given application. In some embodiments, the filter stage 730 comprises configurable filter circuits in which, e.g., the cutoff frequencies of the first and second filter circuits 731 and 732 can be adjusted, or where the first and second filter circuits 731 and 732 can be configured to have different filter types (e.g., low-pass, band-pass, etc.) as desired for a given application. For example, in some embodiments, a bandpass filter can be configured using two low pass filters using known signal filtering techniques and architectures. In some embodiments, the filter configurations are digitally controlled by the digital control signals that are input to the filter stage 730.

In some embodiments, the modulation stage 740 is configured to perform analog IQ signal modulation (e.g., single-sideband (SSB) modulation) by mixing the filtered analog signals I(t) and Q(t), which are output from the filter stage 730, with quadrature LO signals (e.g., an in-phase LO signal (LO_I) and a quadrature-phase analog LO signal (LO_Q)) to generate and output an analog RF signal (e.g., a single-sideband modulated RF output signal). The quadrature LO signals LO_I and LO_Q are generated by the multiphase clock generator 770. In some embodiments, the multiphase clock generator 770 is implemented using the exemplary circuit architecture as shown, for example, in FIG. 1A or 1B. The local oscillator signals LO_I and LO_Q signals each have the same LO frequency, but the LO_Q signal is phase-shifted by 90 degrees relative to the LO_I signal. More specifically, the modulation stage 740 comprises a first mixer circuit 741, a second mixer circuit 742, and a signal combiner circuit 743. The first mixer circuit 741 is configured to mix the filtered analog signal I(t) with the LO_I signal and generate a first RF signal output. The second mixer circuit 742 is configured to mix the filtered analog signal Q(t) with the LO_Q signal and generate a second RF signal output. The first and second RF signals output from the first and second mixer circuits 741 and 742 are input to the signal combiner circuit 743 and combined (e.g., added) to generate a single-sideband RF signal output.

The modulation stage 740 performs an up-conversion modulation process which is configured to generate an RF analog signal which has a center frequency that is greater than the baseband frequency of the baseband signals output from the DAC stage 720. In some embodiments, the LO frequency of the modulation stage 740 is in a range of 100 MHz to about 10 GHz, depending on the application. More specifically, as is understood by those of ordinary skill in the art, as a result of the mixing operations of the first and second mixers 741 and 742, the first and second RF signals that are output from the respective first and second mixers 741 and 742 each comprise a double-sideband RF signal. A double-sideband signal comprises an upper sideband (USB) and a lower sideband (LSB) which are disposed at equal distances above and below the LO frequency. The upper sideband comprises a spectral band of frequencies that is higher than the LO frequency, and the lower sideband comprises a spectral band of frequencies that is lower than the LO frequency. The upper and lower sidebands each carry the same information content of the IQ signals. For example, assume that the filtered analog signals I(t) and Q(t) (i.e., the modulating signals) have a center frequency $f_M$ and that the LO signal has a frequency $f_{LO}$. The first and second RF signals that are output from the first and second mixers 741 and 742 will each have (i) an upper sideband of spectral components, which is frequency-band centered at a frequency of $(f_{LO}+f_M)$ and (ii) a lower sideband of spectral components, which is frequency-band centered at a frequency of $(f_{LO}-f_M)$.

In some embodiments, the signal combiner 743 is configured to add the first and second RF signals which are output from the first and second mixers 741 and 742, in which case the signal combiner 743 will output the "real" lower sideband signal as a single-sideband modulated RF signal (with a suppressed carrier) having a center frequency which is upconverted from the frequency $f_M$ of the modulating signals I(t) and Q(t) to a center frequency $(f_{LO}-f_M)$ of the lower sideband. In other embodiments, the signal combiner 743 is configured to subtract the first and second RF signals which are output from the first and second mixers 741 and 742, in which case the signal combiner 743 will output the "real" upper sideband signal as a single-sideband modulated RF signal (with a suppressed carrier) having a center frequency which is upconverted from the frequency $f_M$ of the modulating signals I(t) and Q(t) to a center frequency $(f_{LO}+f_M)$ of the upper sideband.

In other embodiments, the modulation stage 740 is configured as a double-sideband modulator (with a suppressed carrier). More specifically, the modulation stage 740 can be configured to provide double-sideband modulation by maintaining the LO_Q input to the second mixer 742 at a constant zero voltage level (i.e., LO_Q=0). In this instance, the second mixer 742 will have a zero output (i.e., no RF signal is output from the second mixer 742), and the output of the signal combiner 743 will be the double-sideband RF signal output from the first mixer 741. For example, to illustrate an IQ modulation process which is performed by the modulation stage 740, assume that (i) the in-phase signals are cosine waveforms, (ii) the quadrature-phase signals are sine waveforms, (iii) the analog baseband components I(t) and Q(t) have a baseband frequency $f_M$ (denoted as B), and (iv) the LO_I and LO_Q signals have an LO frequency $f_{LO}$ (denoted as A). With this exemplary notation, the analog baseband signal I(t) is denoted as cos(B), the analog baseband signal Q(t) is denoted sin(B), the LO_I signal is denoted as cos(A), and the LO_Q signal is denoted as sin(B).

Based on product-to-sum trigonometric identities, the following operations are performed by the first and second mixers 741 and 742 of the modulation stage 740. The first mixer 741 mixes the analog in-phase baseband signal I(t) with the LO_I signal by the following multiplication process: cos(A)cos(B)=½[cos(A−B)+cos(A+B)]. The second mixer 742 mixes the analog quadrature-phase baseband signal Q(t) with the LO_Q signal by the following multiplication process: sin(A)sin(B)=½[cos(A−B)−cos(A+B)].

Further, in some embodiments, the signal combiner 743 adds the signals that are output from the first and second mixers 741 and 742 to generate a single-sideband RF output signal ($RF_{OUT}$) as follows: $RF_{OUT}$=(½ [cos(A−B)+cos(A+B)])+(½[cos(A−B)−cos(A+B)])=cos(A−B). In other embodiments, the signal combiner 743 subtracts the signals that are output from the first and second mixers 741 and 742 to generate a single-sideband RF output signal ($RF_{OUT}$) as follows: $RF_{OUT}$=(½ [cos(A−B)+cos(A+B)])−(½ [cos(A−B)−cos(A+B)])=cos(A+B).

The amplifier driver stage 750 is configured to receive the modulated RF signal, which is output from the modulation stage 740, and amplify the modulated RF signal to a desired power level, and drive the output of the transmitter 700 (e.g., drive an antenna that is coupled to an output of the transmitter 700, or drive a sensor device that is coupled to the output of the transmitter 700). In some embodiments, the amplifier driver stage 750 comprises a programmable gain, wherein gain can be expressed as a difference between the input power level (at the input to the amplifier driver stage 750) and the output power level (at the output of the amplifier driver stage 750) or, more specifically, as a ratio of output to input power. The amplifier driver stage 750 is utilized to increase the power level of the RF output signal to a level which is sufficient to transmit (wirelessly or wired) the modulated RF signal at given power level and over a required transmission distance.

The impedance matching network 760 is configured to match a source impedance or load impedance of the output of the amplifier driver stage 750 to a characteristic impedance of an output load (e.g., antenna input, diplexer, etc.) of the transmitter 700. In some embodiments, the impedance matching network 760 comprises a balun to convert a differential/balance output of the amplifier driver stage 750 to a single/unbalance output. In some embodiments, the output of the impedance matching network 760 is coupled to an antenna system. In other embodiments, the output of the impedance matching network 760 is coupled to a sensor device. In some embodiments, the resonance parameters (e.g., impedance and bandwidth) of the matching network 760 remain substantially invariant, wherein the matching network 760 is designed with a center frequency which corresponds to the RF transmission frequency of the transmitter 700 (e.g., 2.4 GHz).

In other embodiments, the matching network 760 is configured with a plurality of injection points to provide different impedance matching and filtering characteristics. The different injection points can be selected by digital control signals applied to the matching network 760. The matching network 760 can have high pass or low pass characteristics, wherein the different injection points can be selected to provide a different impedance matching and frequency response. In some embodiments, the impedance matching network 760 is designed with a high-Q factor, wherein the center frequency of the impedance matching network 760 can be adjusted to provide sufficient impedance matching for different transmission frequencies which are generated by, e.g., changing the sampling frequency of the DAC stage 720 and/or changing the LO frequency of modulation stage 740, depending on the given application.

Figure 8:
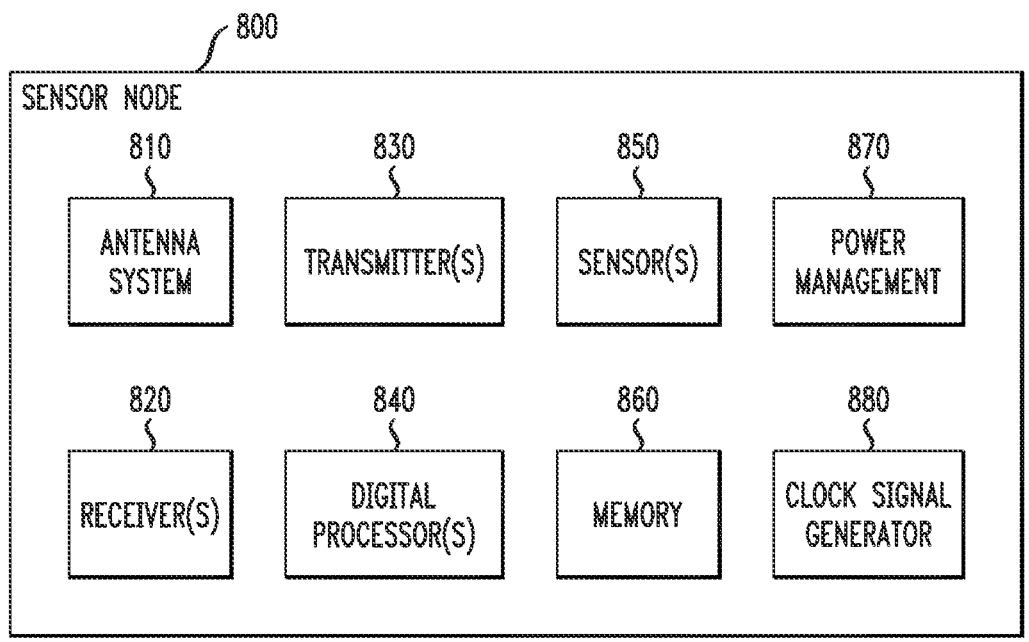
FIG. 8 schematically illustrates a sensor node, according to an exemplary embodiment of the disclosure.

FIG. 8 schematically illustrates a sensor node according to an exemplary embodiment of the disclosure. More specifically, FIG. 8 schematically illustrates a sensor node 800 which comprises an antenna system 810, one or more receivers 820 (e.g., single or multi-channel receiver), one or more transmitters 830 (e.g., single or multi-channel transmitter), one or more digital processors 840, one or more sensors 850, memory 860, a power management system 870, and a clock signal generator 880. In some embodiments, the sensor node 800 comprises a node in a network of sensor nodes which is configured to collect and process sensor information and communicate with other nodes (e.g., sensor nodes, computing nodes, etc.) in the network.

The antenna system 810 comprises one or more antenna elements, (e.g., wideband antenna, narrow band antenna elements, antenna array, etc.) antenna feed elements and networks, diplexers, duplexers, etc. In some embodiments, the antenna system 810 comprises printed antenna elements, or discrete elements such as whip antennas, etc. The receivers 820 and transmitters 830 collectively provide a transceiver system which is coupled to the antenna system 810. In some embodiments, the transmitter 830 is implemented using the exemplary transmitter architecture as discussed above.

The digital processors 840 include one or more processors such as CPUs, microcontrollers, digital signal processors, ASICs, FPGAs, etc., which are configured to control operations of the sensor node 800 and components thereof, and to collect and process sensor data. In particular, in some embodiments, the digital processors 840 include a microcontroller that is configured to generate the control signals that are input to the various signal processing stages of the transmitters as shown in, e.g., FIG. 7 to configure the hardware configurations of the stages to change the operating parameters, e.g., adjust gain, control LO frequencies, etc. In some embodiments, the digital processors 840 include a microcontroller or control circuitry to implement the phase imbalance detector circuitry 150 and 151 (FIGS. 1A and 1B) and the related control functions (e.g., FIG. 5) as discussed above.

The sensors 850 are utilized to capture data within a given environment. For example, the sensors 850 include hardware devices that generate a measurable signal in response to a change in physical conduction such as temperature, pressure, humidity, light, etc. In some embodiments, the sensors 850 generate analog signals that are digitized and processed by a digital signal processor. In some embodiments, the sensor data is transmitted to a remote node by converting the digital sensor data to digital IQ baseband signals (e.g., via element 710, FIG. 7), converting the digital IQ baseband signals to analog baseband voltage signals, and optionally upconverting the analog baseband voltage signals to a higher transmission frequency, and thereby generate an RF output signal via the transmitters 830 for wireless transmission via the antenna system 810.

The memory 860 includes volatile memory (e.g., RAM, cache) which is utilized by the digital processors 840, and non-volatile memory such as flash memory for storing sensor and application related data, and for storing software or code for programming the various components of the sensor node 800 and controlling operations and functions of the sensor node 800.

The power management system 870 comprises various elements such as a power supply (e.g., batteries, capacitors), a voltage regulation circuit, and a power management system such as a dynamic power management (DPM) system which is configured to power down components of the sensor node 800 which are currently inactive and not in use, or a dynamic voltage scaling (DVS) system, which is configured to adjust operating power levels and/or operating frequencies within the sensor node 800 to reduce power consumption.

The clock signal generator 880 comprises various components and circuits to generate and distribute clock signals for operating the sensor node 800. For example, in some embodiments, the clock signal generator 880 implements the multiphase clock signal generator 100 or 101 as shown in FIG. 1A or 1B to generate a plurality of clock signals having the same frequency, but with different phases, to control various operations of the communications system (e.g., transmitters, receivers, etc.) of the sensor node 800. Such operations include, but are not limited to, RF modulation and demodulation operations, clock and data recovery operations, serializer/deserializer operations, phase acquisition in phase-locked loops, etc. In some embodiments, the multiphase clock signal generator is utilized to generate a plurality of quadrature LO signals with requisite phase delays, which are applied to multiple transmitter channels to implement a phased array antenna system in which a main radiation lobe transmitted from an array of antenna elements of the sensor node can be steered to a desired direction, by applying the proper phases of the LO signals in the transmitter channels. As noted above, in some embodiments in which the clock signal generator 880 implements the multiphase clock signal generator 100 or 101, the functions of the phase imbalance detector circuitry 150 and 151 (FIGS. 1A and 1B) and the related phase adjustment/correction functions (e.g., FIG. 5) as discussed above, can be implemented by the digital processors 840 (e.g., a microcontroller).

Figure 9:
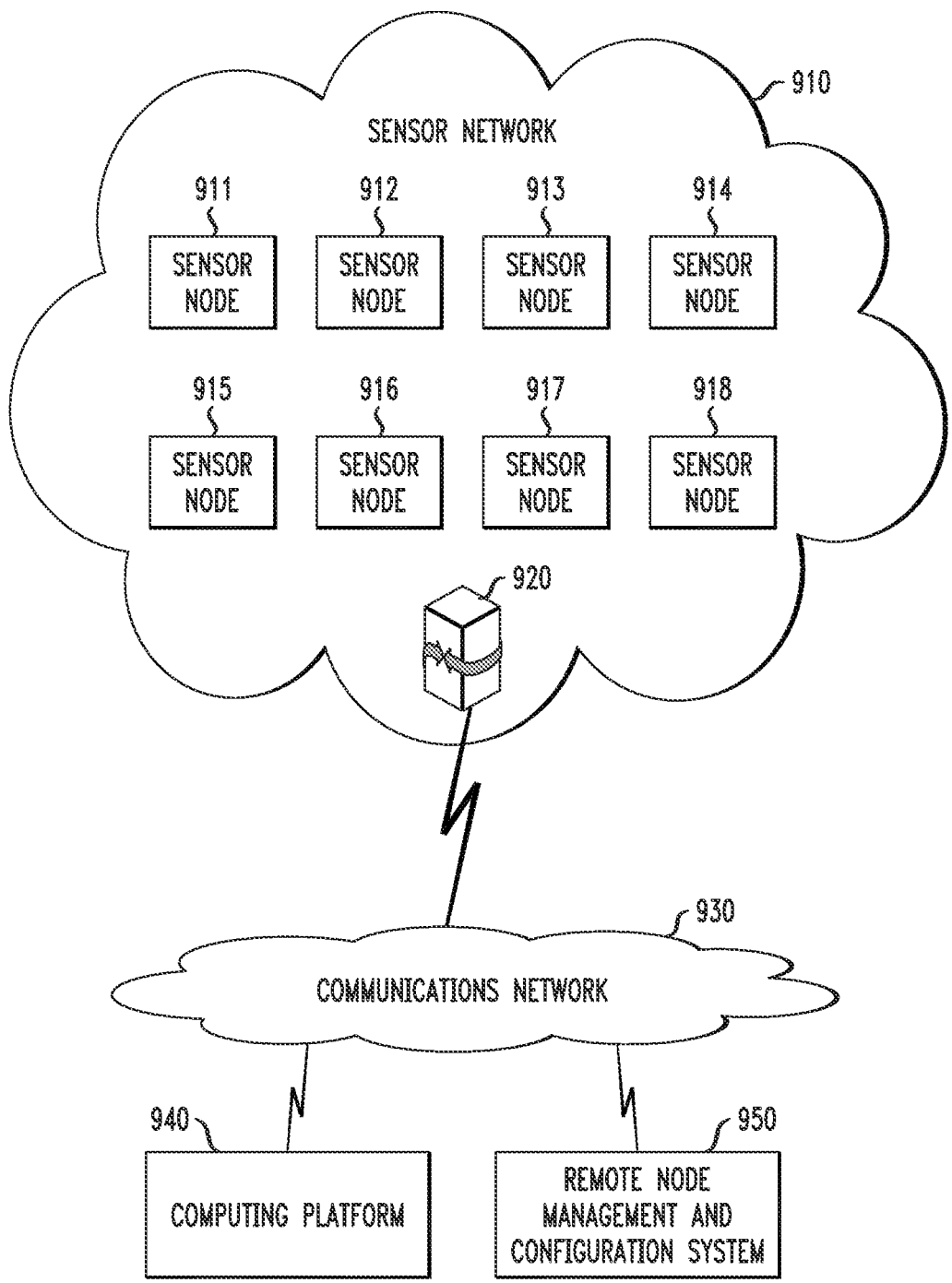
FIG. 9 schematically illustrates a computing system comprising a network of sensor nodes, according to an exemplary embodiment of the disclosure.

FIG. 9 schematically illustrates a computing system comprising a network of sensor nodes which implements transmitters, according to an exemplary embodiment of the disclosure. More specifically, FIG. 9 is a high-level schematic illustration of a computing system 900 which comprises a sensor network 910, a communications network 930, a computing platform 940, and a remote node management and configuration system 950. The computing platform 940 and remote node management and configuration system 950 are coupled to the sensor network 910 via the communications network 930. The communications network 930 may comprise, for example, a global computer network such as the Internet, a wide area network (WAN) a local area network (LAN), a satellite network, a telephone or cable network, a cellular network, a wireless network such as Wi-Fi or WiMAX, or various portions or combinations of these and other types of networks.

The sensor network 910 comprises a plurality of sensor nodes 911, 912, 913, 914, 915, 916, 917, and 918 and a gateway 920. The sensor nodes 911, 912, 913, 914, 915, 916, 917, and 918 collectively generate data that is transmitted to, and utilized by, the computing platform 940 to execute one or more applications. In some embodiments, the sensor nodes 911, 912, 913, 914, 915, 916, 917, and 918 each comprises a sensor node framework such as shown in FIG. 8. The sensor network 910 typically comprises a plurality of sensor nodes that are distributed within a given physical environment to operate in a cooperative manner to monitor one or more physical conditions or events that occur within the given environment. In some embodiments, sensor network 910 deploys wireless sensor nodes to implement a given Internet-of-Things (IoT) application The computing platform 940 comprises one or more application server nodes and a data storage system, wherein the application server nodes host one or more applications that process the data that is generated by the sensor nodes of the sensor network 910 to provide one or more services. In some embodiments, the computing platform 940 comprises an IoT cloud computing system that is configured to support one or more IoT application domains (e.g., healthcare, energy, manufacturing, etc.). The computing platform 940 manages and processes IoT data received from sensor nodes of the sensor network 910 for a given application domain, or from multiple sensor networks for different application domains. For an IoT application, the computing platform 940 performs data processing and storage functions to support one or more IoT cloud computing applications.

The remote node management and configuration system 950 allows a sensor network administrator to remotely configure the sensor nodes in the sensor network 910. Such configuration includes configuration of reconfigurable hardware in the sensor nodes, and software/firmware configuration of the sensor nodes. For example, in some embodiments, the remote node management and configuration system 950 is configured to allow an administrator to command the microcontrollers of the sensor nodes to selectively configure the signal processing stages of the transmitters of the sensor nodes, as desired, for a given application or deployment environment.

Exemplary embodiments of the present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The block diagrams in the Figures illustrate the architecture, functionality, and operation of possible implementations of systems, methods, and computer program products according to various embodiments of the present invention. In this regard, each block in the block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts or carry out combinations of special purpose hardware and computer instructions.

Figure 10:
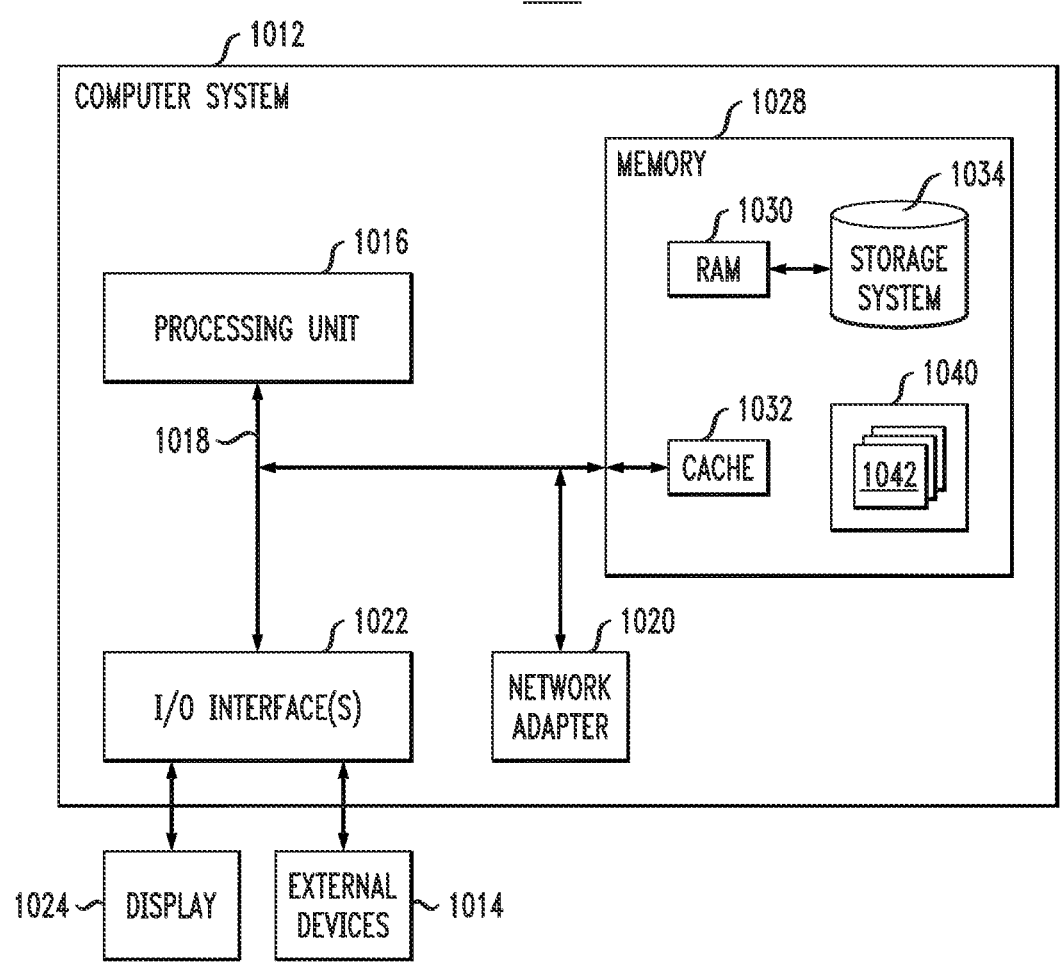
FIG. 10 schematically illustrates an exemplary architecture of a computing node which can host and execute a program for managing and configuring sensor nodes, according to an exemplary embodiment of the disclosure.

These concepts are illustrated with reference to FIG. 10, which schematically illustrates an exemplary architecture of a computing node which can host and execute a program for managing and configuring sensor nodes, according to an exemplary embodiment of the disclosure. In some embodiments, FIG. 10 schematically illustrates a computing node 1000 which is configured to host and execute the remote node management and configuration system 950 of FIG. 9. As shown in FIG. 10, the computing node 1000 comprises a computer system/server 1012, which is operational with numerous other general purpose or special purpose computing system environments or configurations. Examples of well-known computing systems, environments, and/or configurations that may be suitable for use with computer system/server 1012 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 1012 may be described in the general context of computer system executable instructions, such as program modules, being executed by a computer system. Generally, program modules may include routines, programs, objects, components, logic, data structures, and so on that perform particular tasks or implement particular abstract data types. Computer system/server 1012 may be practiced in distributed cloud computing environments where tasks are performed by remote processing devices that are linked through a communications network. In a distributed cloud computing environment, program modules may be located in both local and remote computer system storage media including memory storage devices.

In FIG. 10, computer system/server 1012 in computing node 1000 is shown in the form of a general-purpose computing device. The components of computer system/server 1012 may include, but are not limited to, one or more processors or processing units 1016, a system memory 1028, and a bus 1018 that couples various system components including system memory 1028 to the processors 1016.

The bus 1018 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The computer system/server 1012 typically includes a variety of computer system readable media. Such media may be any available media that is accessible by computer system/server 1012, and it includes both volatile and non-volatile media, removable and non-removable media.

The system memory 1028 can include computer system readable media in the form of volatile memory, such as RAM 1030 and/or cache memory 1032. The computer system/server 1012 may further include other removable/non-removable, volatile/nonvolatile computer system storage media. By way of example only, storage system 1034 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 1018 by one or more data media interfaces. As depicted and described herein, memory 1028 may include at least one program product having a set (e.g., at least one) of program modules that are configured to carry out the functions of embodiments of the invention.

The program/utility 1040, having a set (at least one) of program modules 1042, may be stored in memory 1028 by way of example, and not limitation, as well as an operating system, one or more application programs, other program modules, and program data. Each of the operating system, one or more application programs, other program modules, and program data or some combination thereof, may include an implementation of a networking environment. Program modules 1042 generally carry out the functions and/or methodologies of embodiments of the disclosure as described herein.

Computer system/server 1012 may also communicate with one or more external devices 1014 such as a keyboard, a pointing device, a display 1024, etc., one or more devices that enable a user to interact with computer system/server 1012, and/or any devices (e.g., network card, modem, etc.) that enable computer system/server 1012 to communicate with one or more other computing devices. Such communication can occur via Input/Output (I/O) interfaces 1022. Still yet, computer system/server 1012 can communicate with one or more networks such as a local area network (LAN), a general wide area network (WAN), and/or a public network (e.g., the Internet) via network adapter 1020. As depicted, network adapter 1020 communicates with the other components of computer system/server 1012 via bus 1018. It should be understood that although not shown, other hardware and/or software components could be used in conjunction with computer system/server 1012. Examples, include, but are not limited to: microcode, device drivers, redundant processing units, external disk drive arrays, RAID systems, SSD drives, and data archival storage systems, etc.

Additionally, it is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 11:
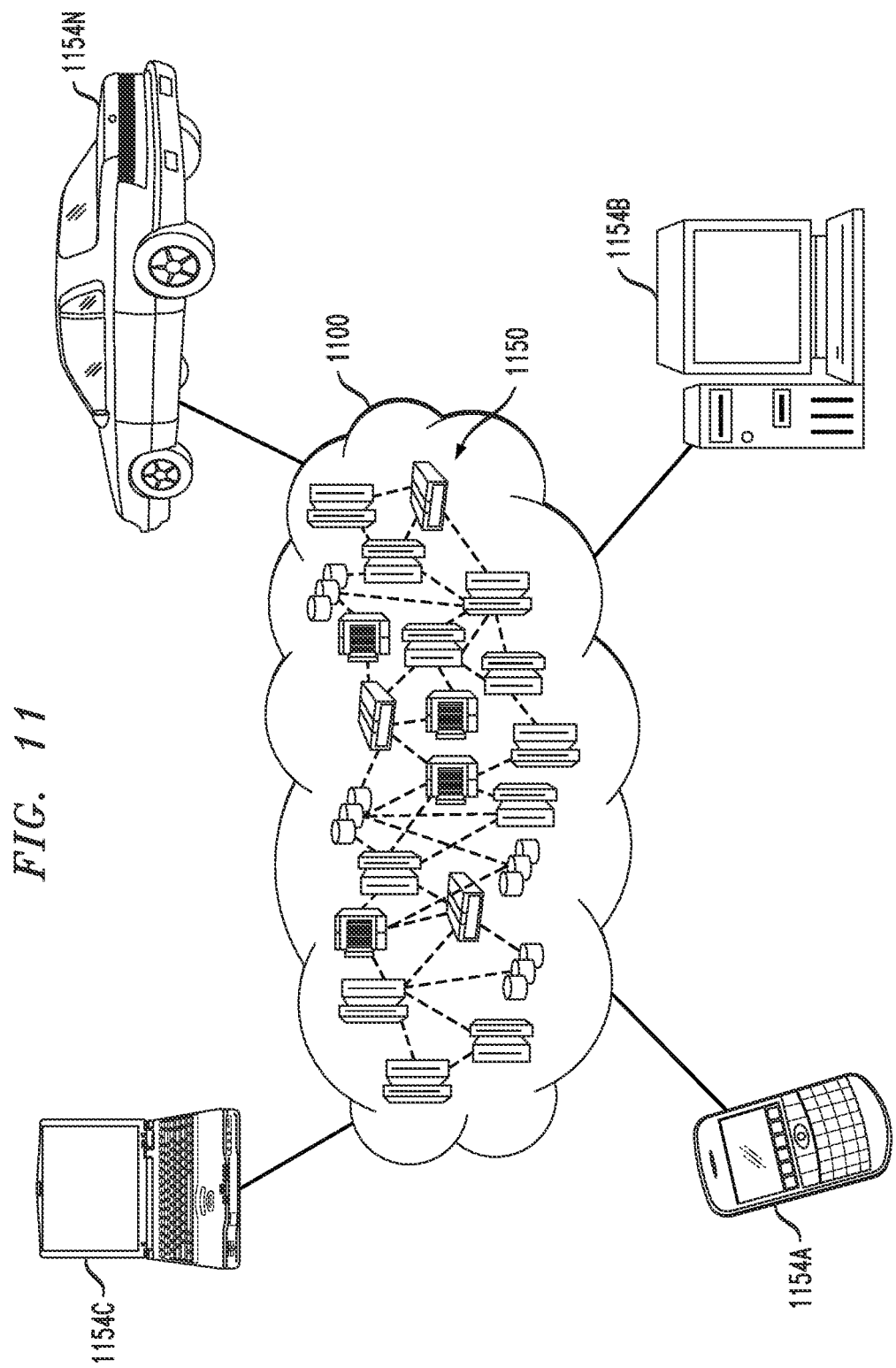
FIG. 11 depicts a cloud computing environment according to an exemplary embodiment of the disclosure.

Referring now to FIG. 11, an illustrative cloud computing environment 1100 is depicted. As shown, the cloud computing environment 1100 includes one or more cloud computing nodes 1150 with which local computing devices used by cloud consumers, such as, for example, personal digital assistant (PDA) or cellular telephone 1154A, desktop computer 1154B, laptop computer 1154C, and/or automobile computer system 1154N may communicate. Nodes 1150 may communicate with one another. They may be grouped (not shown) physically or virtually, in one or more networks, such as Private, Community, Public, or Hybrid clouds as described hereinabove, or a combination thereof. This allows cloud computing environment 1100 to offer infrastructure, platforms and/or software as services for which a cloud consumer does not need to maintain resources on a local computing device. It is understood that the types of computing devices 1154A-N shown in FIG. 11 are intended to be illustrative only and that computing nodes 1150 and cloud computing environment 1100 can communicate with any type of computerized device over any type of network and/or network addressable connection (e.g., using a web browser).

Figure 12:
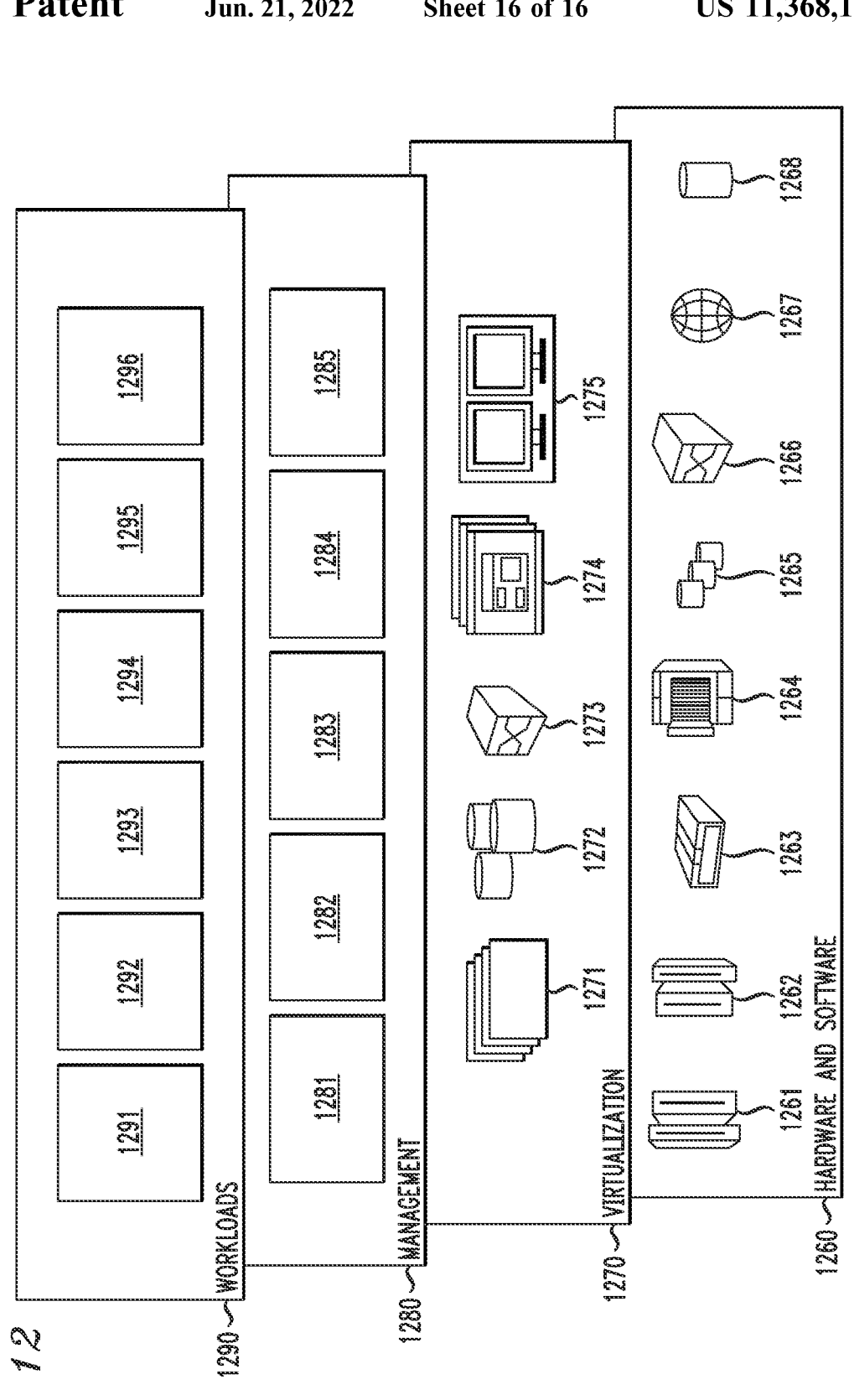
FIG. 12 depicts abstraction model layers according to an exemplary embodiment of the disclosure.

Referring now to FIG. 12, a set of functional abstraction layers provided by cloud computing environment 1100 (FIG. 11) is shown. It should be understood in advance that the components, layers, and functions shown in FIG. 12 are intended to be illustrative only and embodiments of the invention are not limited thereto. As depicted, the following layers and corresponding functions are provided:

Hardware and software layer 1260 includes hardware and software components. Examples of hardware components include: mainframes 1261; RISC (Reduced Instruction Set Computer) architecture based servers 1262; servers 1263; blade servers 1264; storage devices 1265; and networks and networking components 1266. In some embodiments, software components include network application server software 1267 and database software 1268.

Virtualization layer 1270 provides an abstraction layer from which the following examples of virtual entities may be provided: virtual servers 1271; virtual storage 1272; virtual networks 1273, including virtual private networks; virtual applications and operating systems 1274; and virtual clients 1275.

In one example, management layer 1280 may provide the functions described below. Resource provisioning 1281 provides dynamic procurement of computing resources and other resources that are utilized to perform tasks within the cloud computing environment. Metering and Pricing 1282 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1283 provides access to the cloud computing environment for consumers and system administrators. Service level management 1284 provides cloud computing resource allocation and management such that required service levels are met. Service Level Agreement (SLA) planning and fulfillment 1285 provide pre-arrangement for, and procurement of, cloud computing resources for which a future requirement is anticipated in accordance with an SLA.

Workloads layer 1290 provides examples of functionality for which the cloud computing environment may be utilized. Examples of workloads and functions which may be provided from this layer include: mapping and navigation 1291; software development and lifecycle management 1292; virtual classroom education delivery 1293; data analytics processing 1294; transaction processing 1295; and various functions 1296 for selectively configuring operating parameters of signal processing stages of transmitters and other components of sensor nodes and other devices within a sensor network.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus, comprising:
    a multiphase signal generator circuit configured to receive as input a complementary analog signal having a fundamental frequency, and generate a plurality of output complementary analog signals, wherein each output complementary analog signal comprises the same fundamental frequency as the input complementary analog signal, and wherein each output complementary analog signal comprises a different phase;

wherein the multiphase signal generator circuit comprises:
a passive quadrature phase shifter circuit which is configured to convert the input complementary analog signal into complementary analog quadrature signals comprising a complementary in-phase analog signal and a complementary quadrature-phase analog signal;
a phase interpolation circuit which is configured to receive the complementary analog quadrature signals and perform an interpolation process to interpolate between different phases of the complementary analog quadrature signals based on interpolation weights to generate the plurality of output complementary analog signals as weighted summations of the different phases of the complementary analog quadrature signals; and
a control circuit configured to generate interpolation weight voltages which are applied to the phase interpolation circuit and which correspond to the interpolation weights that are utilized by the phase interpolation circuit to control the interpolation process.

2. The apparatus of claim 1, wherein the plurality of output complementary analog signals comprises a complementary in-phase analog signal, and a complementary quadrature-phase analog signal.

3. The apparatus of claim 1, wherein the phase interpolation circuit comprises:
a first load coupled between a first output node of the phase interpolation circuit and a positive supply voltage node;
a second load coupled between a second output node of the phase interpolation circuit and the positive supply voltage node;
a first stage comprising first differential transistor pairs, wherein each first differential transistor pair comprises a first transistor coupled to the first output node of the phase interpolation circuit, and a second transistor coupled to the second output node of the phase interpolation circuit, and wherein the first differential transistor pairs are configured to receive as input the interpolation weight voltages output from the control circuit; and
a second stage comprising second differential transistor pairs, wherein each second differential transistor pair comprises a first transistor and a second transistor, which are coupled to different ones of the first differential transistor pairs of the first stage, and wherein the second differential transistor pairs are configured to receive the complementary analog quadrature signals.

4. The apparatus of claim 3, wherein the interpolation weight voltages comprise direct current (DC) voltages including a first complementary weight voltage and a second complementary weight voltage.

5. The apparatus of claim 3, wherein:
the first and second loads comprise resistive load elements;
the phase interpolation circuit further comprises a plurality of current sources;
each second differential transistor pair of the second stage is coupled to a respective one of the current sources; and
each current source is configured to generate substantially a same bias current.

6. The apparatus of claim 1, wherein the control circuit is further configured to detect a phase imbalance between different phases of the output complementary analog signals and, in response to detecting a phase imbalance, adjust a magnitude of at least one interpolation weight voltage applied to the phase interpolation circuit to correct the detected phase imbalance.

7. The apparatus of claim 1, wherein the multiphase signal generator circuit further comprises:
input buffer circuitry coupled to inputs of the passive quadrature phase shifter circuit; and
output buffer circuitry coupled between outputs of the passive quadrature phase shifter circuit and signal inputs of the phase interpolator circuit;
wherein the input and output buffer circuitry comprise source-follower voltage buffers.

8. The apparatus of claim 1, wherein the passive quadrature phase shifter circuit comprises a multi-stage polyphase quadrature filter circuit comprising a network of capacitors and resistors.

9. The apparatus of claim 8, wherein the passive quadrature phase shifter circuit comprises a configurable quadrature phase shifter circuit, wherein one or more of the capacitors comprise variable capacitors with capacitance values that are adjustable by digital control signals generated by the control circuit.

10. The apparatus of claim 9, wherein at least one variable capacitor comprises a capacitor trimming circuit, wherein the capacitor trimming circuit comprises:
a first switch;
a second switch;
a first capacitor comprising a first capacitance;
a second capacitor comprising a second capacitance, which is different from the first capacitance;
wherein the first switch and the first capacitor are serially connected between a first terminal and a second terminal of the capacitor trimming circuit;
wherein the second switch and the second capacitor are serially connected between the first terminal and the second terminal of the capacitor trimming circuit; and
wherein the first and second switches comprise control terminals that are configured to receive the digital control signals generated by the control circuit.

11. The apparatus of claim 8, wherein the passive quadrature phase shifter circuit comprises a configurable quadrature phase shifter circuit, wherein one or more of the resistors comprise variable resistors with resistance values that are adjustable by digital control signals generated by the control circuit.

12. The apparatus of claim 1, wherein the apparatus comprises a transmitter which implements quadrature modulation using quadrature local oscillator signals generated by the multiphase signal generator circuit.

13. A sensor node, comprising:
at least one sensor device which is configured to generate sensor data;
a communications system configured to transmit the sensor data to a remote node; and
a multiphase signal generator circuit configured to receive as input a complementary analog signal having a fundamental frequency, and generate a plurality of output complementary analog signals, wherein each output complementary analog signal comprises the same fundamental frequency as the input complementary analog signal, and wherein each output complementary analog signal comprises a different phase;

wherein the communications system is further configured to utilize the plurality of output complementary analog signals generated by the multiphase signal generator circuit to control operations of the communications system; and wherein the multiphase signal generator circuit comprises:

a passive quadrature phase shifter circuit which is configured to convert the input complementary analog signal into complementary analog quadrature signals comprising a complementary in-phase analog signal and a complementary quadrature-phase analog signal;

a phase interpolation circuit which is configured to receive the complementary analog quadrature signals and perform an interpolation process to interpolate between different phases of the complementary analog quadrature signals based on interpolation weights to generate the plurality of output complementary analog signals as weighted summations of the different phases of the intermediate complementary analog quadrature signals; and a control circuit configured to generate interpolation weight voltages which are applied to the phase interpolation circuit and which correspond to the interpolation weights that are utilized by the phase interpolation circuit to control the interpolation process.

14. The sensor node of claim 13, wherein the phase interpolation circuit comprises:

a first load coupled between a first output node of the phase interpolation circuit and a positive supply voltage node;

a second load coupled between a second output node of the phase interpolation circuit and the positive supply voltage node;

a first stage comprising first differential transistor pairs, wherein each first differential transistor pair comprises a first transistor coupled to the first output node of the phase interpolation circuit, and a second transistor coupled to the second output node of the phase interpolation circuit, and wherein the first differential transistor pairs are configured to receive as input the interpolation weight voltages output from the control circuit; and a second stage comprising second differential transistor pairs, wherein each second differential transistor pair comprises a first transistor and a second transistor, which are coupled to different ones of the first differential transistor pairs of the first stage, and wherein the second differential transistor pairs are configured to receive the complementary analog quadrature signals.

15. The sensor node of claim 14, wherein:

the first and second loads comprise resistive load elements;

the phase interpolation circuit further comprises a plurality of current sources;

each second differential transistor pair of the second stage is coupled to a respective one of the current sources; and each current source is configured to generate substantially a same bias current.

16. The sensor node of claim 13, wherein the multiphase signal generator circuit further comprises:

input buffer circuitry coupled to inputs of the passive quadrature phase shifter circuit; and output buffer circuitry coupled between outputs of the passive quadrature phase shifter circuit and signal inputs of the phase interpolator circuit;

wherein the input and output buffer circuitry comprise source-follower voltage buffers.

17. The sensor node of claim 13, wherein the passive quadrature phase shifter circuit comprises a multi-stage polyphase quadrature filter circuit comprising a network of capacitors and resistors.

18. The sensor node of claim 17, wherein the passive quadrature phase shifter circuit comprises a configurable quadrature phase shifter circuit, wherein one or more of the capacitors comprise variable capacitors with capacitance values that are adjustable by digital control signals generated by the control circuit.

19. A method comprising:

receiving, by a multiphase signal generator circuit, an input complementary analog signal having a fundamental frequency; and generating, by the multiphase signal generator circuit, a plurality of output complementary analog signals, wherein each output complementary analog signal comprises the same fundamental frequency as the input complementary analog signal, and wherein each output complementary analog signal comprises a different phase;

wherein generating the plurality of output complementary analog signals, comprises:

converting, by a passive quadrature phase shifter circuit, the input complementary analog signal into complementary analog quadrature signals comprising a complementary in-phase analog signal and a complementary quadrature-phase analog signal;

performing, by a phase interpolation circuit, an interpolation process to interpolate between different phases of the complementary analog quadrature signals based on interpolation weights to generate the plurality of output complementary analog signals as weighted summations of the different phases of the complementary analog quadrature signals; and generating, by a control circuit, interpolation weight voltages which are applied to the phase interpolation circuit and which correspond to the interpolation weights that are utilized by the phase interpolation circuit to control the interpolation process.

20. The method of claim 19, further comprising:

detecting, by the control circuit, a phase imbalance between different phases of the output complementary analog signals; and in response to detecting a phase imbalance, adjusting, by the control circuit, a magnitude of at least one interpolation weight voltage applied to the phase interpolation circuit to correct the detected phase imbalance.

21. The method of claim 19, further comprising:

detecting, by the control circuit, a phase imbalance between different phases of the output complementary analog signals; and in response to detecting a phase imbalance, generating, by the control circuit, a digital control signal to adjust a value of at least one variable resistor or variable capacitor of the passive quadrature phase shifter circuit to correct the detected phase imbalance.

* * * * *